US012506227B2

(12) United States Patent
Fukushima et al.

(10) Patent No.: US 12,506,227 B2
(45) Date of Patent: Dec. 23, 2025

(54) WIRING MODULE

(71) Applicants: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(72) Inventors: Naoki Fukushima, Mie (JP); Osamu Nakayama, Mie (JP); Katsushi Miyazaki, Mie (JP); Mitsutoshi Morita, Mie (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIE, LTD., Osaka (JP)

( * ) Notice: Subject to any disclaimer, the term of this patent is extended or adjusted under 35 U.S.C. 154(b) by 541 days.

(21) Appl. No.: 18/014,250

(22) PCT Filed: Jul. 2, 2021

(86) PCT No.: PCT/JP2021/025159
§ 371 (c)(1),
(2) Date: Jan. 3, 2023

(87) PCT Pub. No.: WO2022/014378
PCT Pub. Date: Jan. 20, 2022

(65) Prior Publication Data
US 2023/0261333 A1 Aug. 17, 2023

(30) Foreign Application Priority Data

Jul. 14, 2020 (JP) .................................. 2020-120516
Dec. 23, 2020 (JP) .................................. 2020-213217

(51) Int. Cl.
H01M 50/519 (2021.01)
H01M 50/298 (2021.01)
(Continued)

(52) U.S. Cl.
CPC ....... *H01M 50/519* (2021.01); *H01M 50/298* (2021.01); *H01M 50/516* (2021.01);
(Continued)

(58) Field of Classification Search
None
See application file for complete search history.

(56) References Cited

U.S. PATENT DOCUMENTS 11,602,050 B2 * 3/2023 Takahashi ........... H01M 50/502
12,113,243 B2 * 10/2024 Takahashi ............. H05K 1/189
(Continued)

FOREIGN PATENT DOCUMENTS

JP         2576335      7/1998
JP       2004-186505    7/2004
(Continued)

OTHER PUBLICATIONS

International Search Report issued in International Bureau of WIPO Patent Application No. PCT/JP2021/025159, dated Sep. 7, 2021, along with an English translation thereof.

*Primary Examiner* — Kevin M Bernatz
(74) *Attorney, Agent, or Firm* — Greenblum & Bernstein, P.L.C.

(57) ABSTRACT

A wiring module is attached to a plurality of power storage elements, and includes: a flexible printed circuit board; and a protector holding the flexible printed circuit board, wherein the flexible printed circuit board includes a base film, a plurality of conduction paths that are disposed on a surface of the base film, and a connector that has an opposing surface opposing the surface of the base film and
(Continued)

that is connected to the plurality of conduction paths, the plurality of conduction paths and electrode terminals of the plurality of power storage elements are electrically connected, the connector includes connection portions that are connected to the plurality of conduction paths, and at least some of the plurality of conduction paths are routed from the connection portions through a space between the surface of the base film and the opposing surface of the connector.

11 Claims, 26 Drawing Sheets

(51) Int. Cl.
*H01M 50/516* (2021.01)
*H01R 12/65* (2011.01)
*H01R 12/78* (2011.01)
*H05K 1/02* (2006.01)
*H05K 1/18* (2006.01)

(52) U.S. Cl.
CPC ........... *H05K 1/0281* (2013.01); *H05K 1/189* (2013.01); *H01R 12/65* (2013.01); *H01R 12/78* (2013.01); *H05K 2201/09236* (2013.01); *H05K 2201/10189* (2013.01)

(56) References Cited

U.S. PATENT DOCUMENTS

| | | | |
|---|---|---|---|
| 12,219,694 B2 * | 2/2025 | Takahashi | H05K 1/0268 |
| 12,388,159 B2 * | 8/2025 | Fukushima | H01M 50/588 |
| 2013/0252074 A1 | 9/2013 | Hsiao et al. | |
| 2019/0001838 A1 * | 1/2019 | Choi | B60L 50/60 |
| 2019/0245185 A1 * | 8/2019 | Ishihara | H01M 50/519 |
| 2020/0020912 A1 * | 1/2020 | Ota | H01M 50/50 |
| 2022/0006159 A1 * | 1/2022 | Takahashi | H01M 50/519 |
| 2022/0013868 A1 | 1/2022 | Takahashi et al. | |
| 2023/0231259 A1 * | 7/2023 | Takada | H01M 10/425 |
| | | | 429/163 |

FOREIGN PATENT DOCUMENTS

| | | | | |
|---|---|---|---|---|
| JP | 2013-197090 | 9/2013 | | |
| JP | 2019-511810 | 4/2019 | | |
| JP | 2020-013655 | 1/2020 | | |
| JP | 2020-087665 | 6/2020 | | |
| WO | WO-2020105400 A1 * | 5/2020 | | H01M 50/50 |

* cited by examiner

WIRING MODULE

TECHNICAL FIELD

The present disclosure relates to a wiring module.

BACKGROUND ART

In high-voltage battery packs used in electric automobiles, hybrid automobiles, and the like, many battery cells are usually stacked and electrically connected to one another in series or in parallel using wiring modules. As such wiring modules, the wiring modules disclosed in JP 2019-511810A (hereinafter Patent Document 1) are conventionally known. A battery module disclosed in Patent Document 1 is configured to include a plurality of battery cells having electrode leads protruding in the front-rear direction of the battery module, and a bus-bar unit that integrally connects the electrode leads of the plurality of battery cells. This bus-bar unit includes a first bus-bar frame that is attached to the front side of the plurality of battery cells and that holds first bus bars connected to forward-protruding electrode leads, a second bus-bar frame that is attached to the rear side of the plurality of battery cells and that holds second bus bars connected to rearward-protruding electrode leads, and a sensing bus bar that electrically connects the first and second bus bars.

CITATION LIST

Patent Documents

Patent Document 1: JP 2019-511810A

SUMMARY OF INVENTION

Technical Problem

In order to detect the voltage, etc., of each battery cell in the above-described configuration, it is conceivable to arrange an output connector on the first bus-bar frame and connect a mating connector for external output to the connector. In this case, because the sensing bus bar needs to be connected to the connector, the sensing bus bar needs to be routed to the rear surface of the connector, i.e., the surface of the connector on the reverse side from a fitting surface to which the mating connector fits. Here, depending on the arrangement of the connector, it may become necessary to route the sensing bus bar to the rear surface side of the connector so that the sensing bus bar makes a detour around the connector, and this may lead to an increase in the space necessary for routing the sensing bus bar and a consequent increase in battery pack size.

The present disclosure has been completed based on such circumstances, and an object thereof is to provide a wiring module capable of realizing a reduction in height and space.

Solution to Problem

A wiring module according to the present disclosure is a wiring module attached to a plurality of power storage elements, the wiring module including: a flexible printed circuit board; and a protector holding the flexible printed circuit board, wherein the flexible printed circuit board includes a base film, a plurality of conduction paths that are disposed on a surface of the base film, and a connector that has an opposing surface opposing the surface of the base film and that is connected to the plurality of conduction paths, the plurality of conduction paths and electrode terminals of the plurality of power storage elements are electrically connected, the connector includes connection portions that are connected to the plurality of conduction paths, and at least some of the plurality of conduction paths are routed from the connection portions through a space between the surface of the base film and the opposing surface of the connector.

Advantageous Effects of Invention

According to the present disclosure, a wiring module capable of realizing a reduction in height and space can be provided.

DESCRIPTION OF EMBODIMENTS

Description of Embodiments of Present Disclosure

Figure 1:
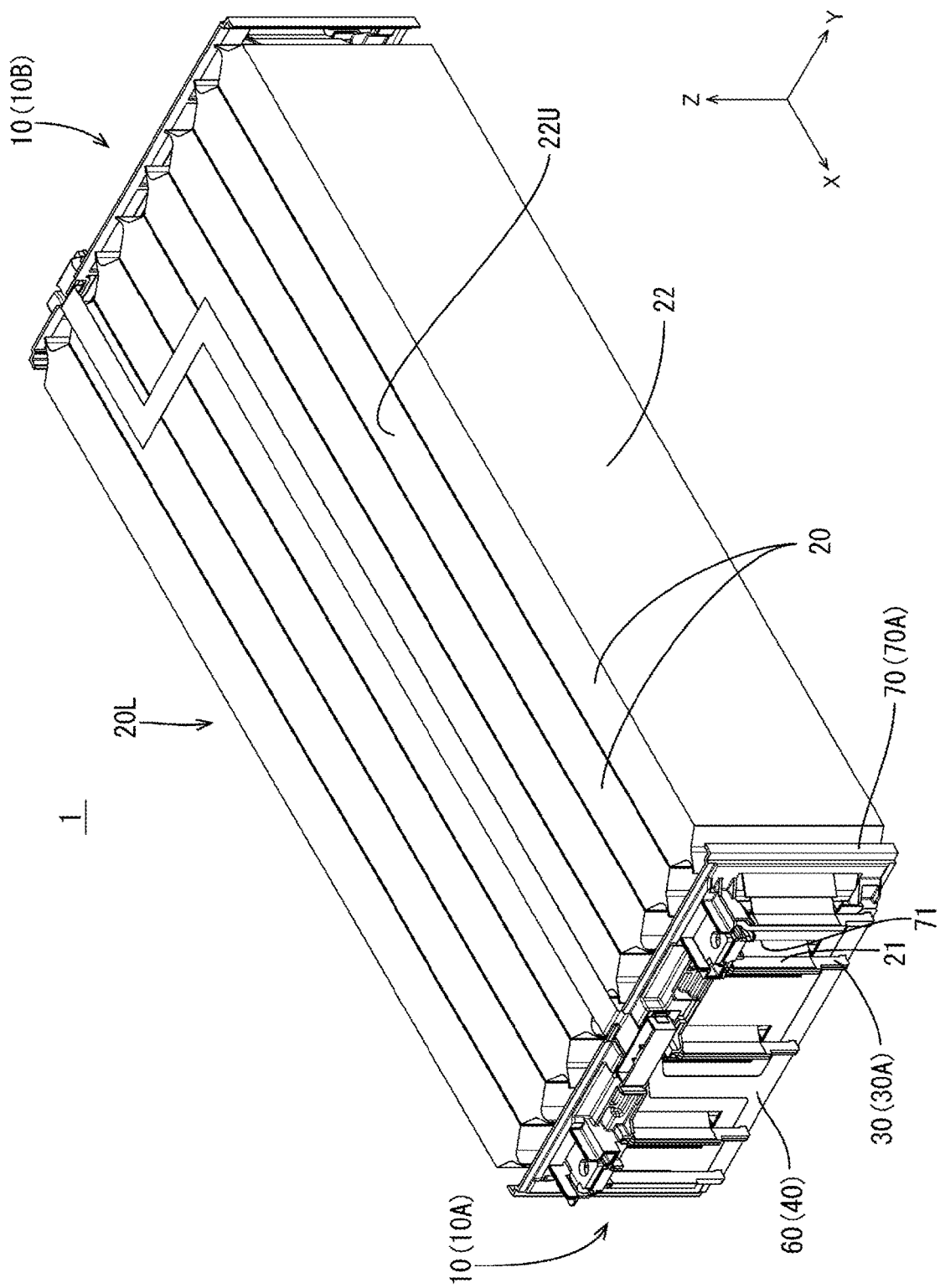
FIG. 1 is a perspective view of a battery module according to embodiment 1.

First, aspects of the present disclosure will be listed and described.

(1) A wiring module according to the present disclosure is a wiring module attached to a plurality of power storage elements, including: a flexible printed circuit board; and a protector holding the flexible printed circuit board, wherein the flexible printed circuit board includes a base film, a plurality of conduction paths that are disposed on a surface of the base film, and a connector that has an opposing surface opposing the surface of the base film and that is connected to the plurality of conduction paths, the plurality of conduction paths and electrode terminals of the plurality of power storage elements are electrically connected, the connector includes connection portions that are connected to the plurality of conduction paths, and at least some of the plurality of conduction paths are routed from the connection portions through a space between the surface of the base film and the opposing surface of the connector.

According to such a configuration, the space necessary for routing the plurality of conduction paths can be reduced because at least some of the plurality of conduction paths pass through the space between the surface of the base film and the opposing surface of the connector. Accordingly, the height of the wiring module and the space occupied by the wiring module can be reduced.

The wiring module according to the present disclosure may be configured as follows.

(2) The surface of the base film intersects a first direction, and the connector has an opening portion that is open on the opposite side from the opposing surface in the first direction and that receives a mating connector that is fitted to the connector.

According to such a configuration, the fitting of the connector and the mating connector to one another can be performed in the first direction.

Furthermore, the wiring module according to the present disclosure may be configured as follows.

(3) The surface of the base film intersects a first direction, the connector has an opening portion that is open on one side in a second direction intersecting the first direction and that receives a mating connector that is fitted to the connector, and the connection portions are disposed on the other side of the connector in the second direction.

According to such a configuration, the fitting of the connector and the mating connector to one another can be performed in the second direction.

(4) Preferably, the plurality of conduction paths include first conduction paths that are routed from the connection portions toward the opposite direction from the opening portion, and second conduction paths that are routed from the connection portions through the space between the surface of the base film and the opposing surface of the connector.

According to such a configuration, the height of the wiring module and the space occupied by the wiring module can be reduced to a further extent.

(5) The second conduction paths are routed from the connection portions toward the opening portion.

(6) The second conduction paths are bent in the vicinity of the opening portion of the connector and routed toward a direction that is different from the second direction. Note that it is further preferable that the vicinity of the opening portion specifically be a position on the other side in the second direction from the opening portion.

According to such a configuration, the connector and the mating connector can be easily fitted to and separated from one another.

(7) Preferably, a reinforcement plate is provided on the reverse side of the base film from the connector in the first direction.

According to such a configuration, the strength of the flexible printed circuit board against stress applied thereto when the connector and the mating connector are fitted to and separated from one another can be improved.

(8) Preferably, a recess portion in which the bent second conduction paths are routed is provided in an end portion of the protector on the one side in the second direction.

The plurality of power storage elements having the wiring module attached thereto may be configured to be protected by being further covered from the outside using a case, a cover, or the like. This being the case, there is a concern that the second conduction paths may be damaged as a result of being caught between the protector and a cover or the like. According to the above-described configuration, because the clearance between the protector and a cover or the like increases due to the recess portion, the second conduction paths are less susceptible to being damaged by being caught between the protector and a cover or the like.

(9) Preferably, the protector is provided with a locking portion for locking the second conduction paths routed in the recess portion.

According to such a configuration, because the position of the second conduction paths can be restricted using the locking portion, the second conduction paths are even less susceptible to being damaged by being caught between the protector and a cover or the like.

(10) Electroconductive members are connected to the electrode terminals, the flexible printed circuit board includes lands, and the lands are connected to at least one side surface of the electroconductive members by soldering.

(11) Preferably, the lands are connected to only one side surface of the electroconductive members by soldering.

According to such a configuration, the work efficiency of the soldering of the lands and the electroconductive members to one another is improved.

DETAILS OF EMBODIMENTS OF PRESENT DISCLOSURE

Embodiments of the present disclosure will be described below. The present disclosure is not limited to these examples, and is intended to include all modifications that are indicated by the claims and are within the meaning and scope of equivalents of the claims.

Embodiment 1

Embodiment 1 of the present disclosure will be described with reference to FIGS. 1 to 13. A battery module 1 that includes wiring modules 10 according to the present embodiment is installed in a vehicle such as an electric automobile or a hybrid automobile as a power source for driving the vehicle, for example. In the following description, description will be provided regarding the directions indicated by the arrows Z, X, and Y as the upward, forward, and left directions, respectively. Here, the front-rear direction and the up-down direction are examples of the first direction and the second direction, respectively. Note that, when more than one of a given member is provided, the reference sign therefor may be provided to only some of the members and may be omitted for the rest.

Figure 2:
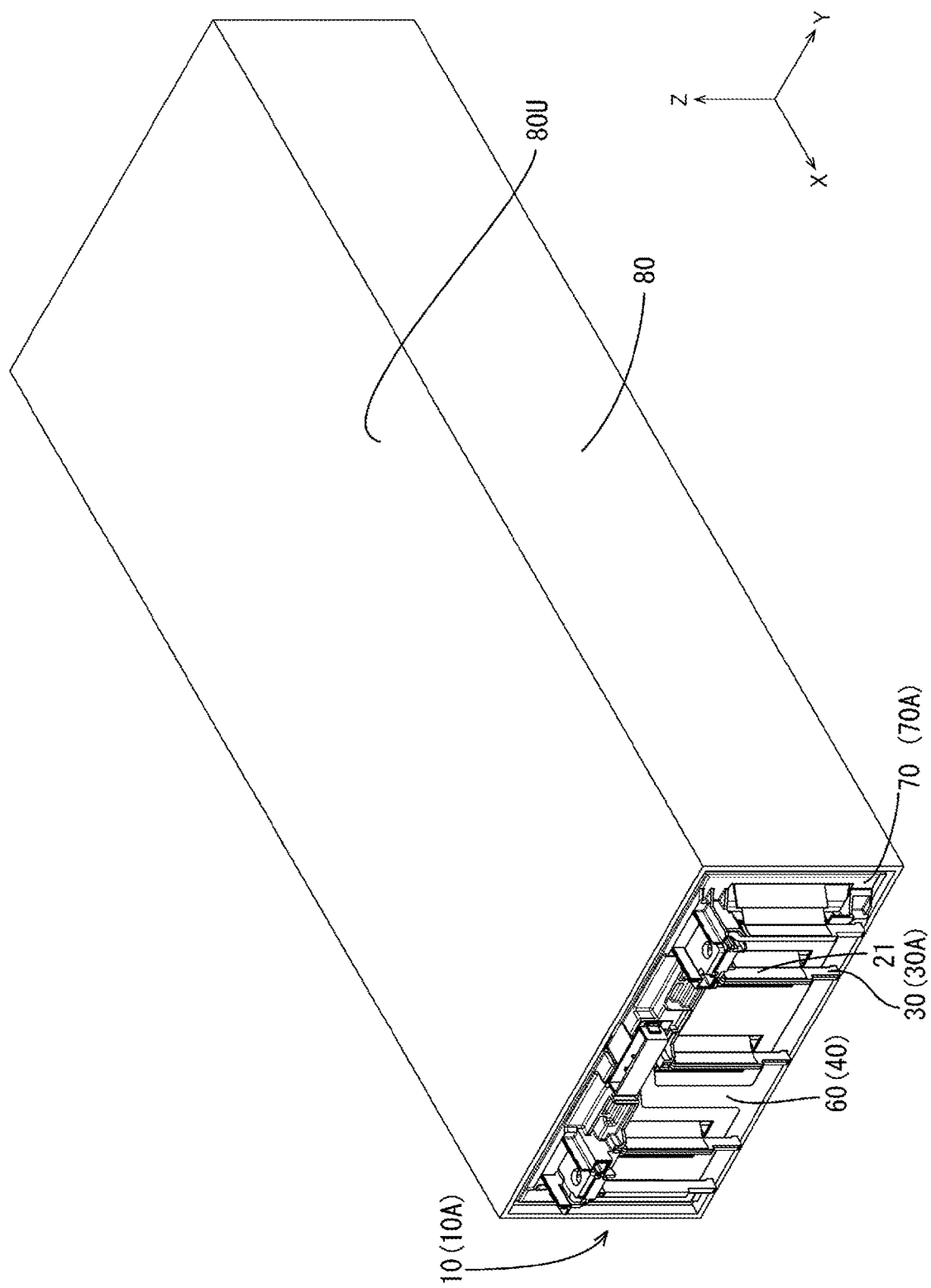
FIG. 2 is a perspective view of the battery module in a state in which covers have been attached thereto.

As illustrated in FIG. 1, the battery module 1 includes a battery-cell laminate 20L (one example of the plurality of power storage elements) and the wiring modules attached to the battery-cell laminate 20L. As illustrated in FIG. 2, the upper, lower, left, and right side surfaces of the battery module 1 are covered by covers 80.

Battery Cells and Electrode Leads

Figure 5:
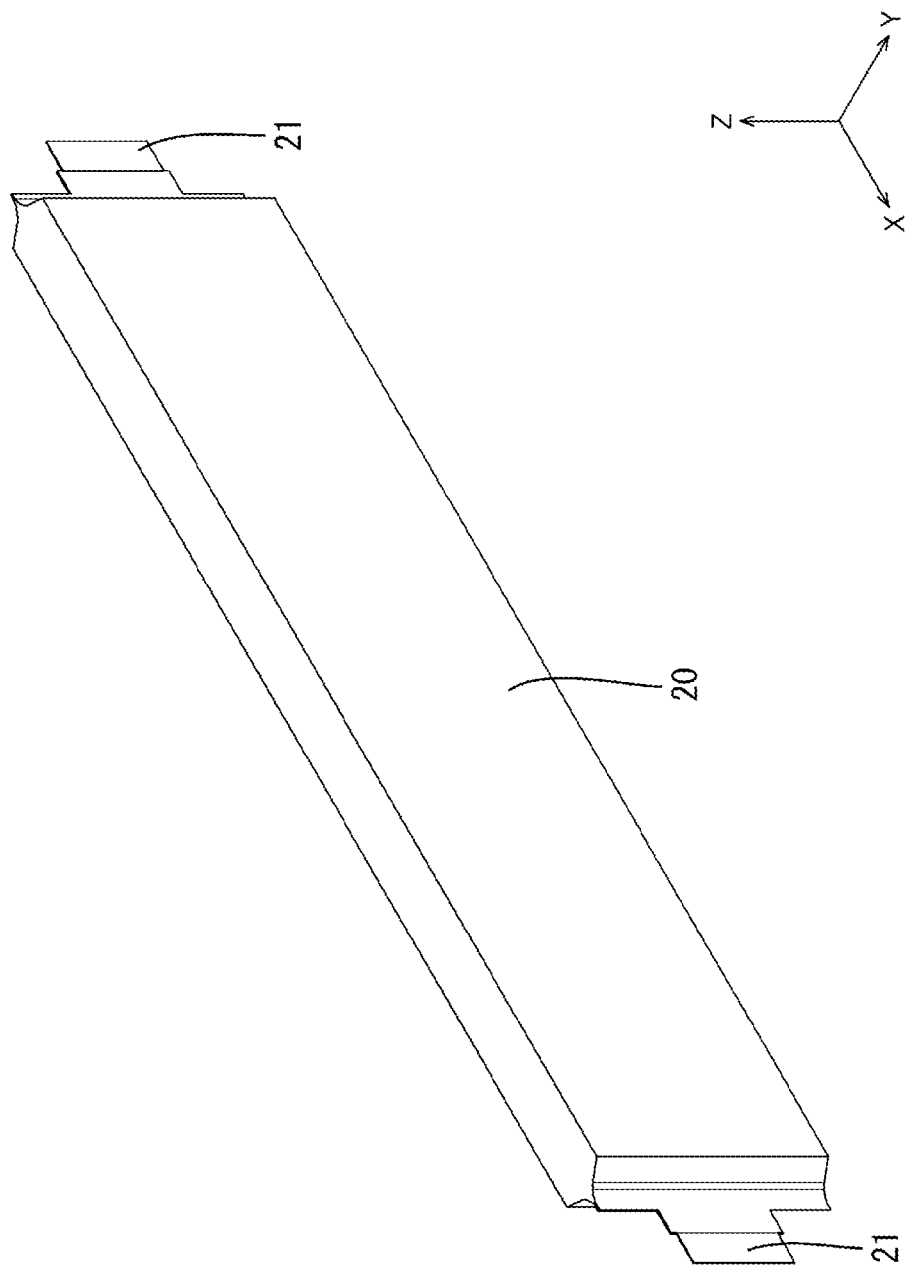
FIG. 5 is a perspective view of a battery cell.

As illustrated in FIG. 1, the battery-cell laminate 20L is formed by arranging a plurality of battery cells 20 (one example of the power storage elements) in the left-right direction. As illustrated in FIG. 5, each battery cell 20 is elongated in the front-rear direction and flat in the left-right direction. A power storage element (unillustrated) is housed inside the battery cell 20. The battery cell 20 has a pair of electrode leads 21 (one example of the electrode terminals). The electrode leads 21 forming a pair are respectively arranged on the two sides of the battery cell 20 in the front-rear direction, and protrude so as to face mutually opposite directions. The pair of electrode leads 21 have a plate-like shape and have mutually opposite polarities. Specifically, the electrode lead 21 on one side of the battery cell 20 in the front-rear direction is a negative electrode, and the electrode lead 21 on the other side is a positive electrode.

In the present embodiment, each battery cell 20 is a secondary battery such as a lithium-ion battery, for example.

As illustrated in FIG. 1, the battery-cell laminate 20L includes the forward-protruding electrode leads 21 of the battery cells 20 and the rearward-protruding electrode leads 21 of the battery cells 20. As described later, one of the wiring modules 10 according to the present embodiment is attached to each of the front and rear sides of the battery-cell laminate 20L, and is electrically connected to the electrode leads 21 of the battery cells 20 on each side. The electrode leads 21 of the battery-cell laminate 20L are bent as appropriate and cut into the necessary length so that the electrode leads 21 can be connected to the wiring modules 10.

Wiring Modules and Flexible Printed Circuit Board

As illustrated in FIG. 1, the wiring modules 10 include bus bars 30 (one example of the electroconductive members) connected to the electrode leads 21, a flexible printed circuit board (hereinafter "FPC") 60 connected to the bus bars 30, and protectors 70 that hold the bus bars 30 and the FPC 60.

Base Film and Conduction Paths

Figure 11:
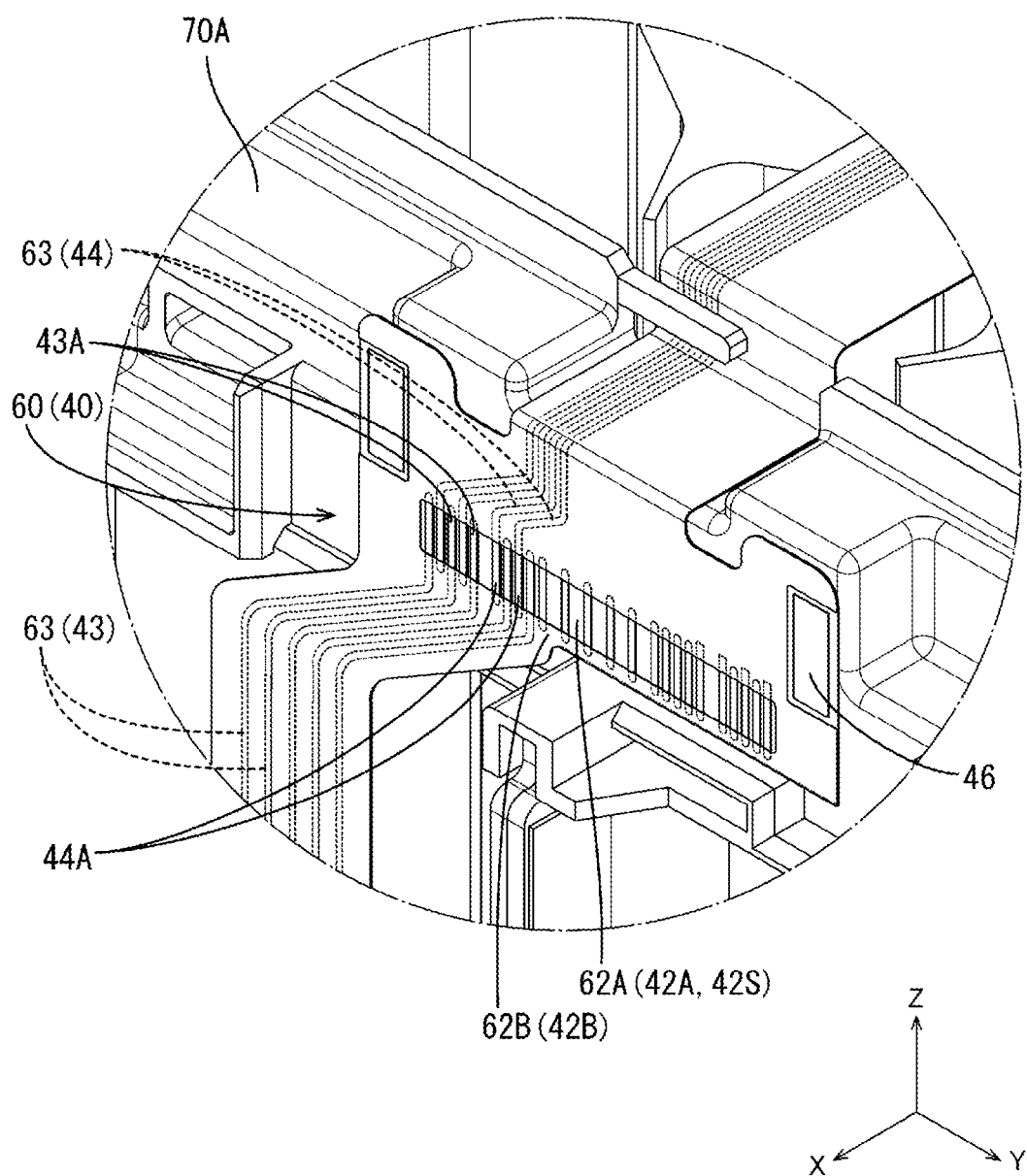
FIG. 11 is a perspective view in which the output connector in FIG. 9 has been omitted.

As illustrated in FIG. 11, the FPC 60 includes a base film 62A, a plurality of conduction paths 63 disposed on the surface of the base film 62A, and coverlay films 62B covering the plurality of conduction paths 63. The base film 62A and the coverlay films 62B are made from a synthetic resin, such as polyimide, having an insulating property and flexibility. The plurality of conduction paths 63 are formed from metal foils of copper, a copper alloy, and the like. Although not illustrated or described in the following, optional electronic components such as resistors, capacitors, and transistors can be connected to the conduction paths 63.

Figure 8:
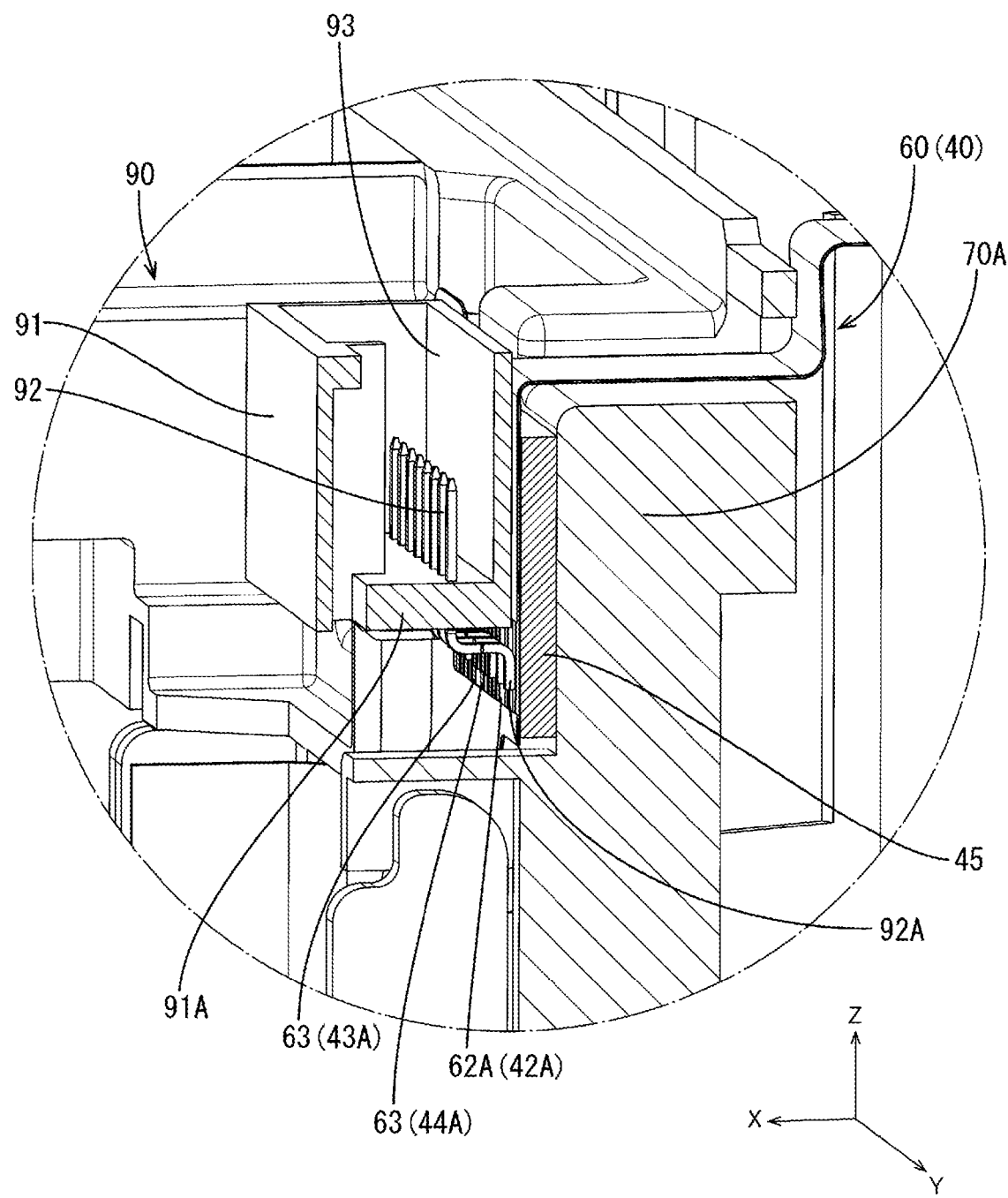
FIG. 8 is a perspective view of a cross-section taken along line A-A in FIG. 3.

As illustrated in FIG. 8, the FPC 60 further includes an output connector 90 (one example of the connector) connected to the plurality of conduction paths 63. The conduction paths 63 are electrically connected to an unillustrated external electronic control unit (ECU) via the output connector 90. The ECU has one or more microcomputers, elements, etc., installed thereon, and is that having a known configuration provided with functions for performing the detection of the voltage, current, temperature, etc., of the battery cells 20, the control of the charge and discharge of the battery cells 20, etc.

Figure 4:
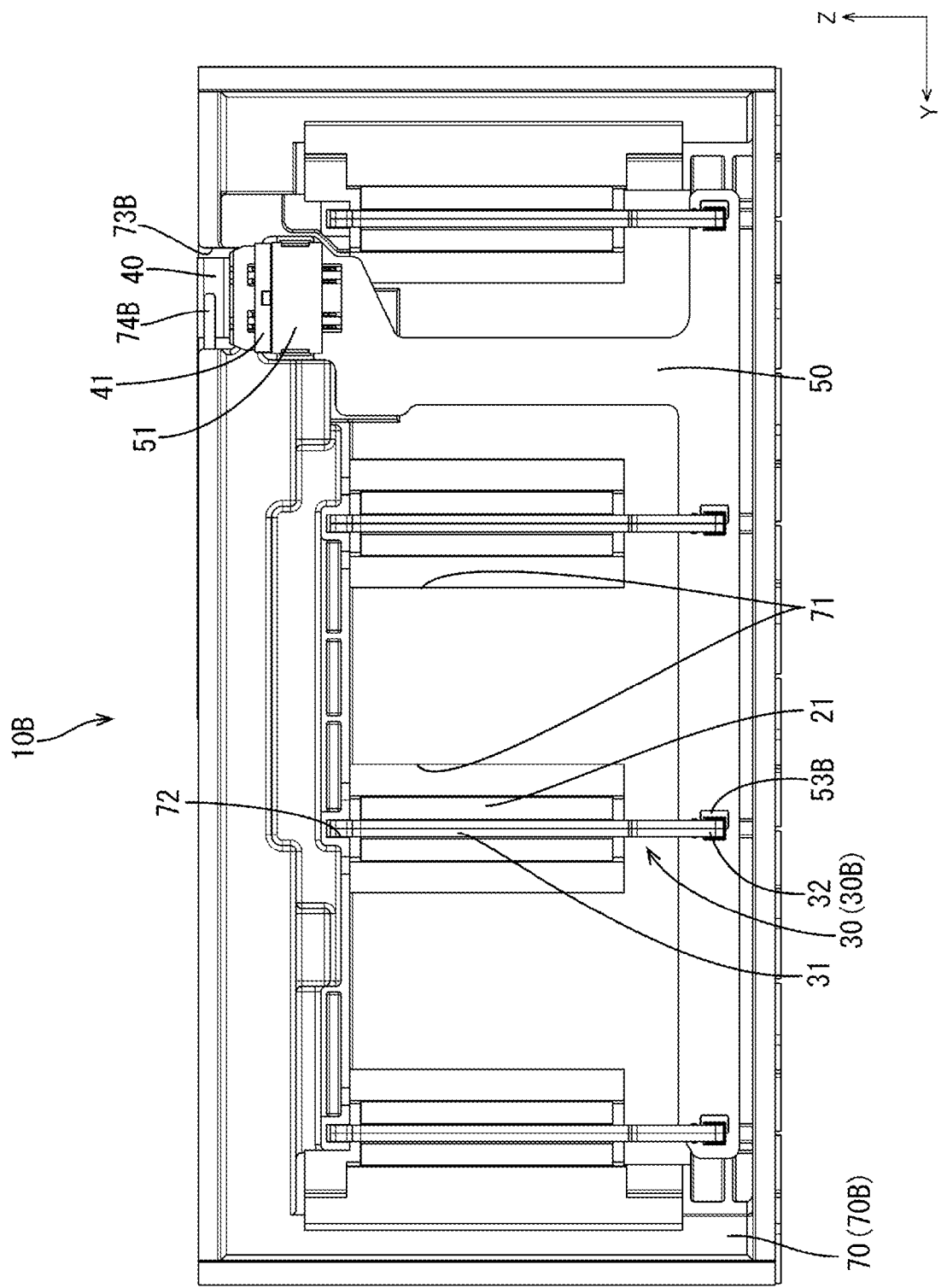
FIG. 4 is a rear view of the battery module.
Figure 12:
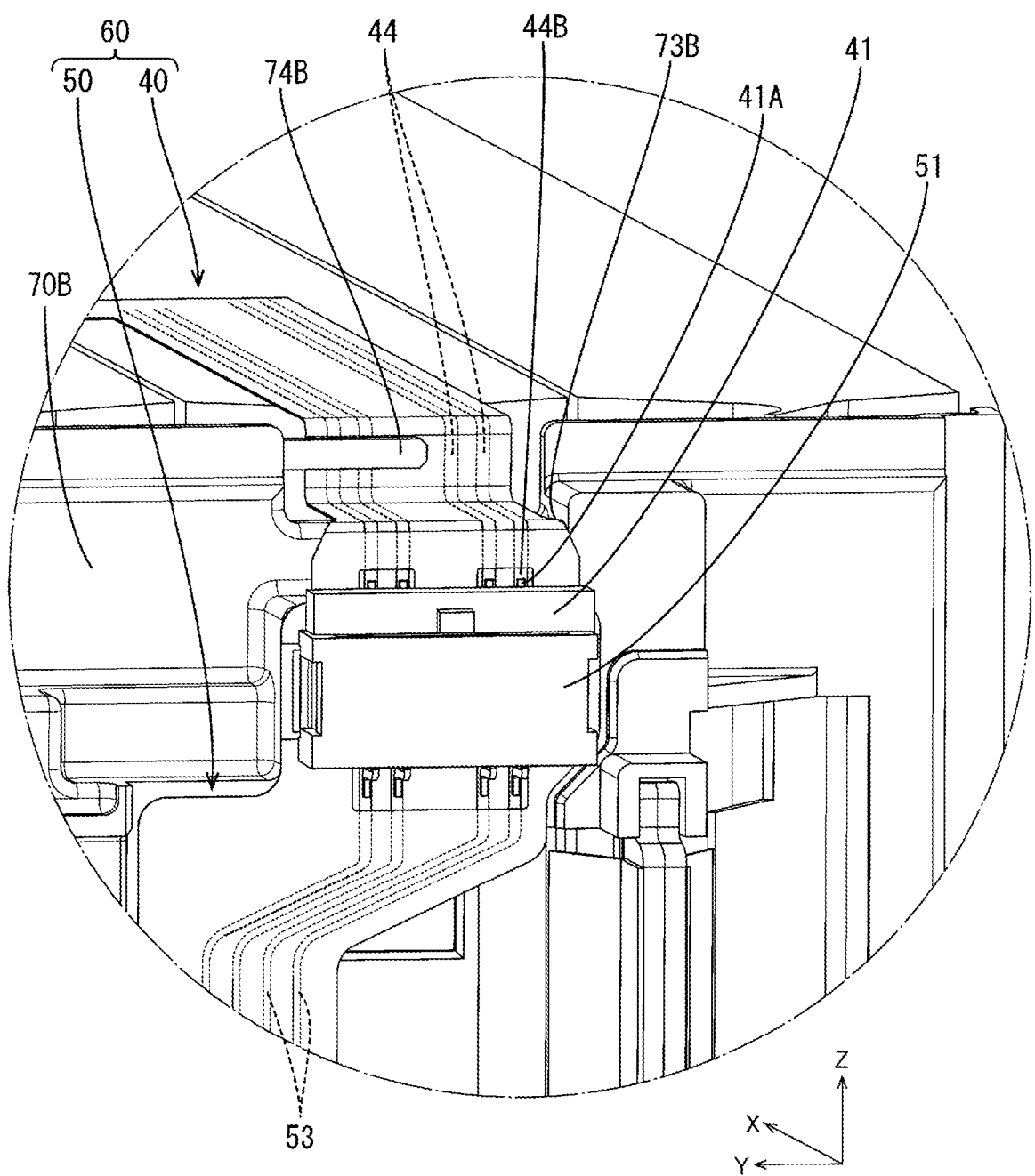
FIG. 12 is a diagram illustrating an area of the battery module in the vicinity of a second connector.

The FPC 60 is divided into a first FPC 40 (see FIG. 6) including the output connector 90, and a second FPC 50 (see FIG. 4). As illustrated in FIG. 12, a first connector 41 is provided at an end portion of the first FPC 40, and a second connector 51 is provided at an end portion of the second FPC 50. The first connector 41 and the second connector 51 can be fitted to and separated from one another, and the FPC 60 is thus provided so as to be dividable into separate members.

As illustrated in FIG. 1, among the wiring modules 10, the member that is attached to the front side of the battery-cell laminate 20L constitutes a first bus bar module 10A, and the member that is attached to the rear side of the battery-cell laminate 20L constitutes a second bus bar module 10B.

Figure 3:
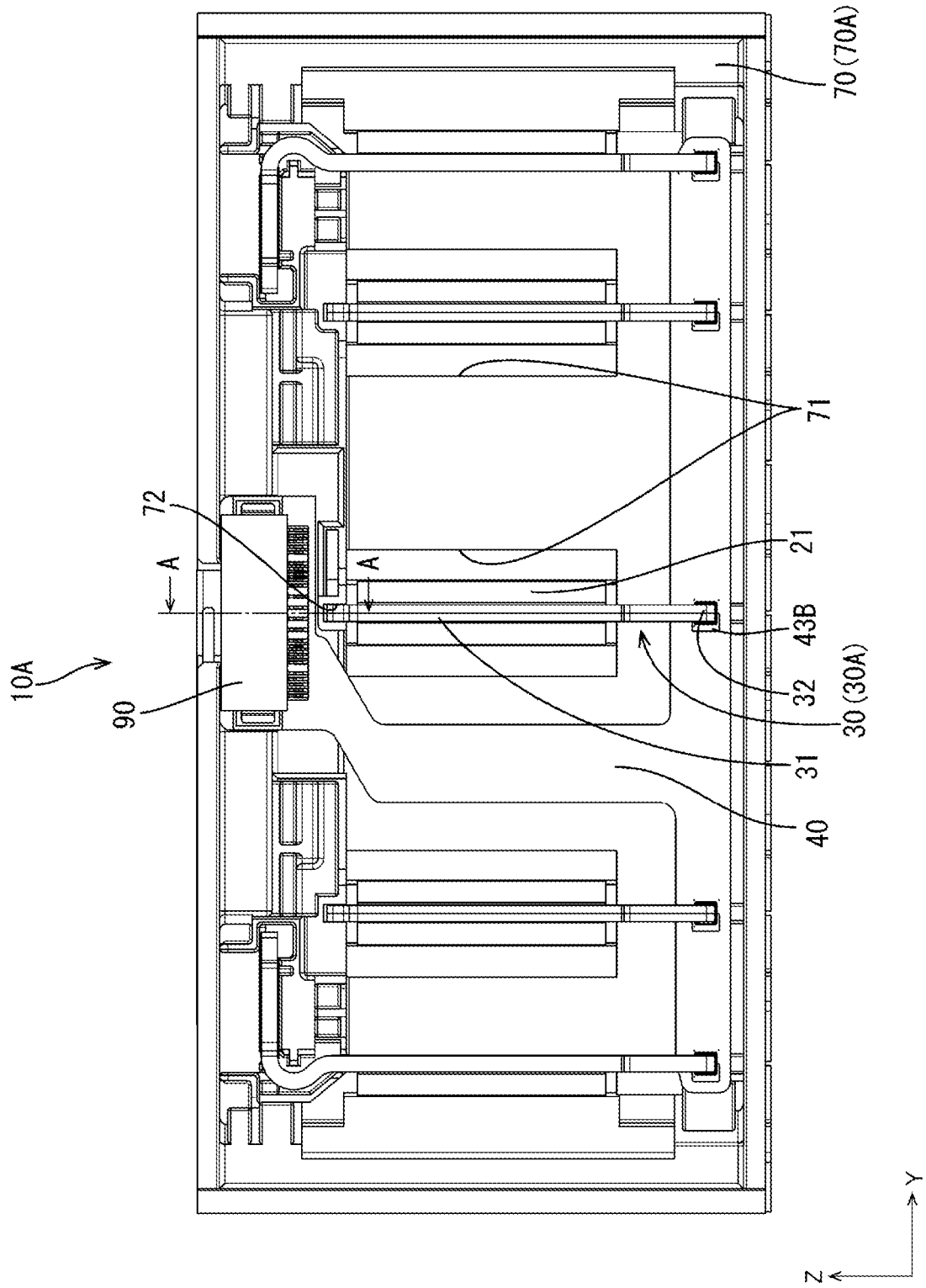
FIG. 3 is a front view of the battery module.

As illustrated in FIG. 3, the first bus bar module 10A includes first bus bars 30A (one example of the electroconductive members), among the bus bars 30, that are connected to the forward-protruding electrode leads 21, the first FPC 40 connected to the first bus bars 30A, and a first protector 70A (one example of the protector), among the protectors 70, that holds the first bus bars 30A and the first FPC 40. The first bus bars 30A disposed at the left and right ends of the first bus bar module 10A function as electrode terminals of the battery module 1.

As illustrated in FIG. 4, the second bus bar module 10B includes second bus bars 30B (one example of the electroconductive members), among the bus bars 30, that are connected to the rearward-protruding electrode leads 21, the second FPC 50 connected to the second bus bars 30B, and a second protector 70B (one example of the protector), among the protectors 70, that holds the second bus bars 30B and the second FPC 50.

As illustrated in FIGS. 1 and 2, in a state in which the first bus bar module 10A and the second bus bar module 10B are attached to the battery-cell laminate 20L, outer surfaces 22 of the battery-cell laminate 20L excluding the front and rear sides are covered by the covers 80. The first FPC 40 extending in the front-rear direction is disposed on an upper outer surface 22U of the battery-cell laminate 20L, and is covered by an upper cover 80U.

First Protector, Recess Portion, and Locking Portion

Figure 6:
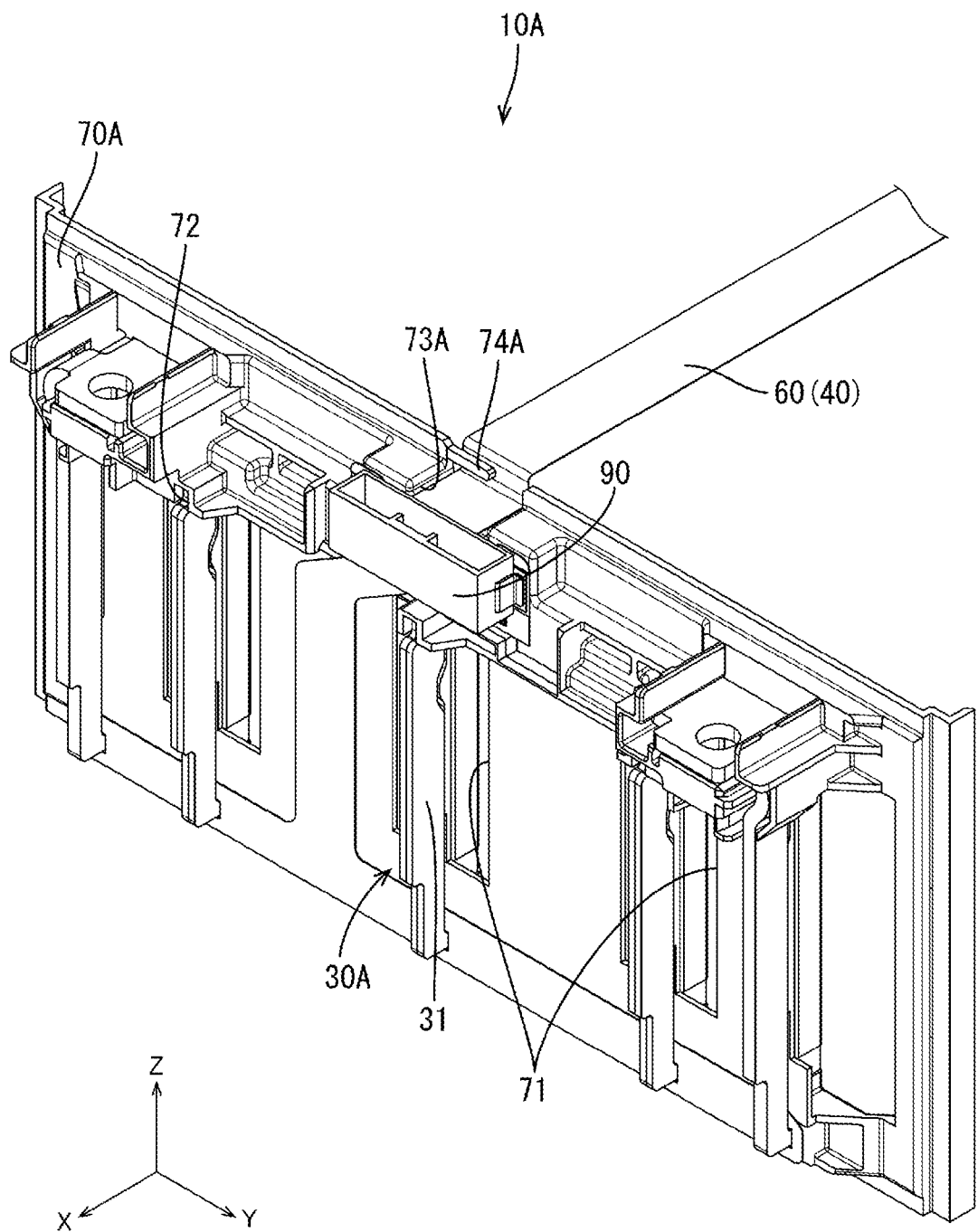
FIG. 6 is a perspective view of a first bus bar module.
Figure 9:
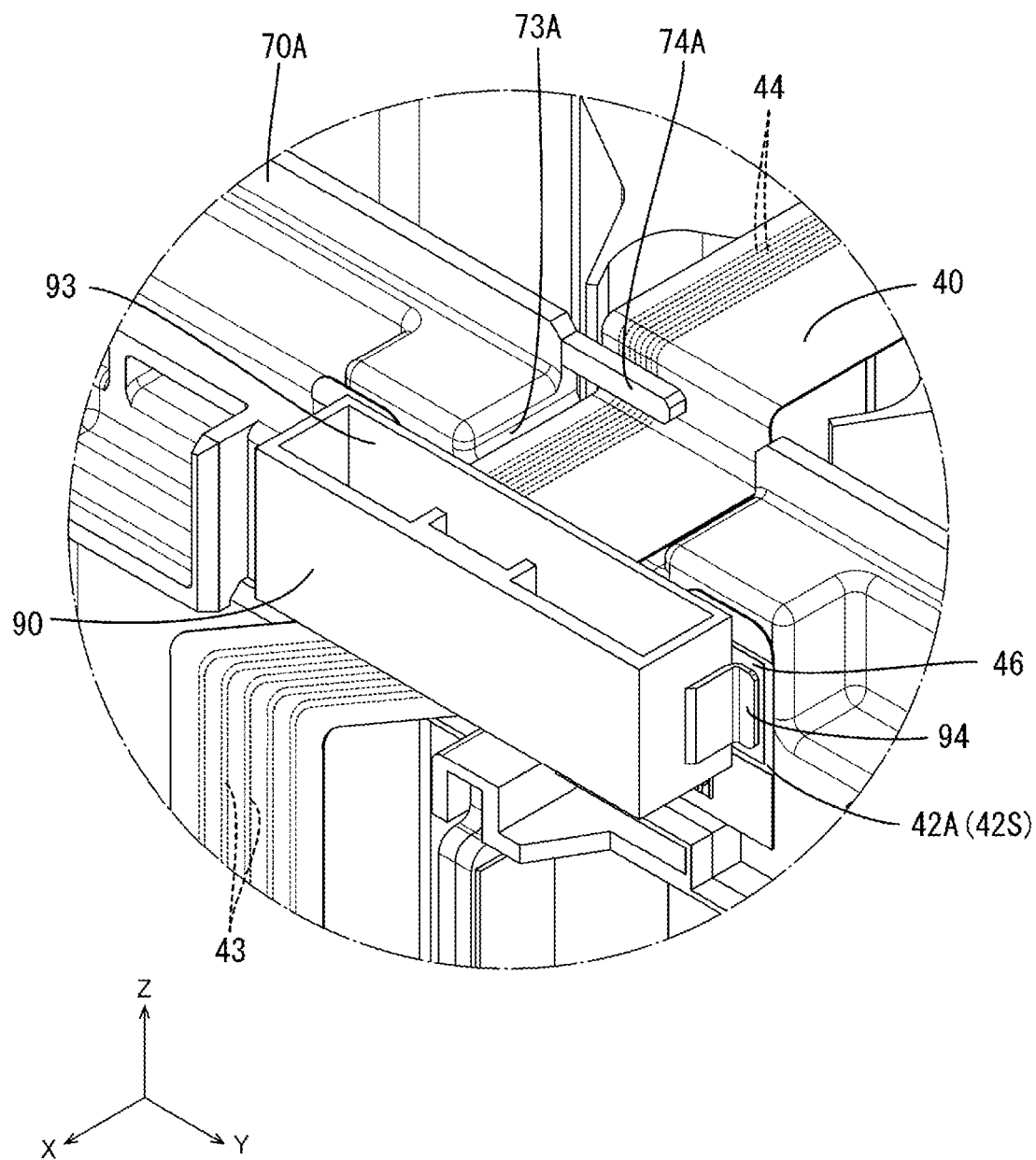
FIG. 9 is a perspective view illustrating an area of the battery module in the vicinity of the output connector.

The first protector 70A is made from an insulative synthetic resin, and has a plate-like shape, as illustrated in FIG. 6. A plurality of electrode-receiving portions 71 are provided in the center part of the first protector 70A in the up-down direction. The plurality of electrode-receiving portions 71 are formed so as to be arranged side by side in the left-right direction and so as to extend through the first protector 70A in the front-rear direction, and have a rectangular shape that is long in the up-down direction. Groove portions 72 that hold first bus bars 30A are provided in the upper side of the first protector 70A. A groove-shaped recess portion 73A that is recessed downward is formed in the center of the upper part of the first protector 70A in the left-right direction. As illustrated in FIG. 9, the first FPC 40 (including second conduction paths 44) bent at the upper end portion of the first protector 70A is passed through the recess portion 73A. This will be described in detail. The first FPC 40 is bent downward at a right angle at the front end of the outer surface 22U of the battery-cell laminate 20L, and extends downward along the rear surface of the recess portion 73A. Then, the first FPC 40 is bent toward the front at a right angle, and extends forward along the lower surface of the recess portion 73A, before being bent downward at a right angle.

Figure 10:
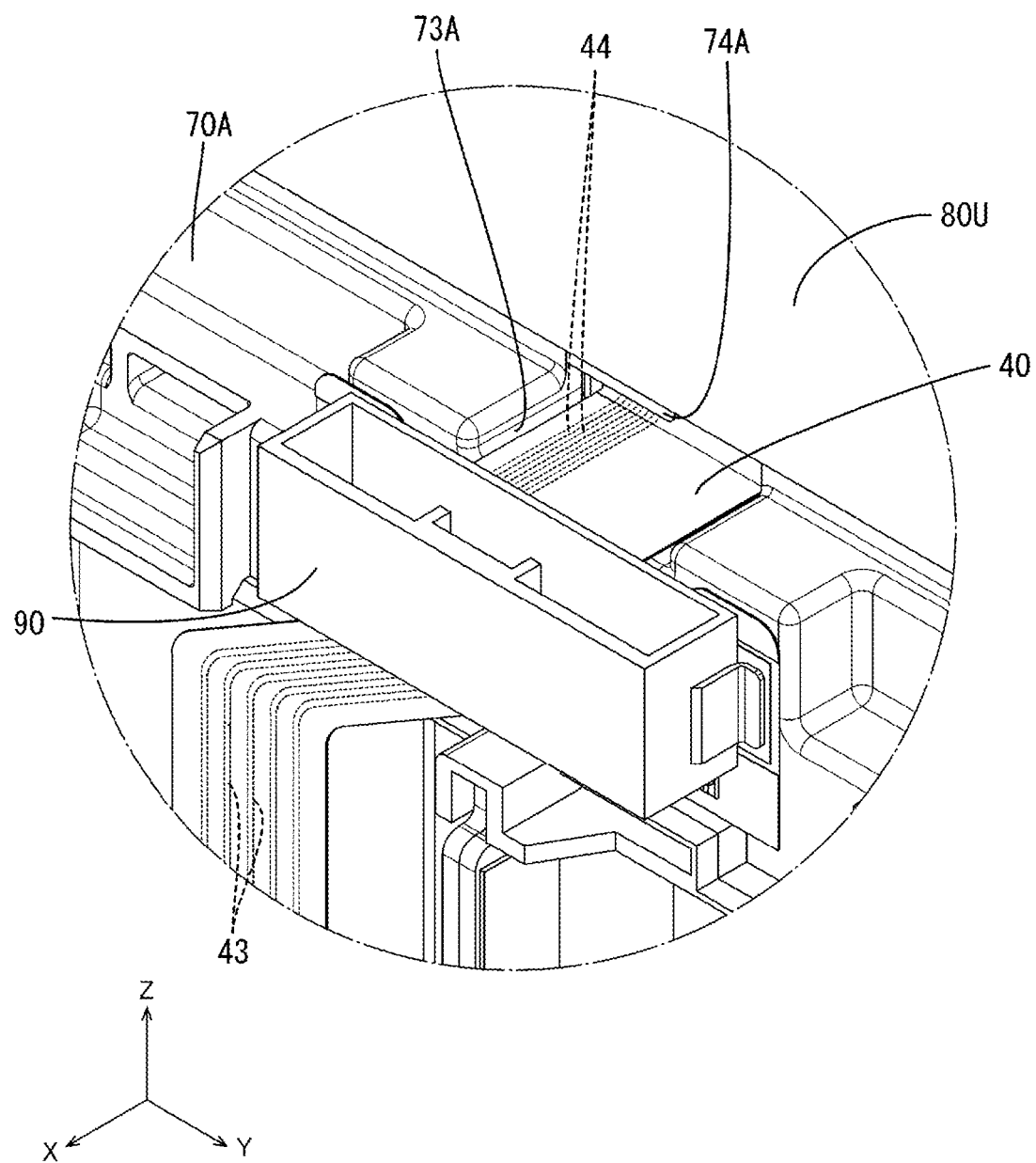
FIG. 10 is a perspective view illustrating the area in the vicinity of the output connector of the battery module in a state in which the covers have been attached thereto.

A rod-shaped locking portion 74A is provided so as to protrude toward the left on the right-side inner wall of the recess portion 73A. The locking portion 74A is disposed at the rear end portion of the first protector 70A. The first FPC 40 passed through the recess portion 73A is locked inside the recess portion 73A by the locking portion 74A. Because the distance from the lower surface of the recess portion 73A to the locking portion 74A is greater than the maximum thickness of the first FPC 40, the first FPC 40 is held in the recess portion 73A so that the first FPC 40 does not protrude forward. Damage to the first FPC 40 as a result of the first FPC 40 being caught between the first protector 70A and the upper cover 80U when the upper outer surface 22U (see FIG. 1) of the battery-cell laminate 20L is covered with the upper cover 80U as illustrated in FIG. 10 is suppressed because the first FPC 40 is passed through the recess portion 73A and locked inside the recess portion 73A by the locking portion 74A.

Second Protector

Similarly to the first protector 70A, the second protector 70B also includes electrode-receiving portions 71, groove portions 72, a recess portion 73B, and a locking portion 74B, as illustrated in FIG. 4. The recess portion 73B is formed in the right side of the upper part of the second protector 70B. As illustrated in FIG. 12, the first FPC 40 (including the second conduction paths 44) bent at the upper end portion of the second protector 70B is passed through the recess portion 73B. This will be described in detail. The first FPC 40 is bent downward at a right angle at the rear end of the outer surface 22U of the battery-cell laminate 20L, and extends downward along the front surface of the recess portion 73B. Then, the first FPC 40 is bent toward the rear at a right angle, and extends rearward along the lower surface of the recess portion 73B, before being bent downward at a right angle. A rod-shaped locking portion 74B is provided so as to protrude toward the right on the left-side inner wall of the recess portion 73B. The locking portion 74B is disposed at the front end portion of the second protector 70B. The first FPC 40 passed through the recess portion 73B is locked inside the recess portion 73B by the locking portion 74B. Because the distance from the lower surface of the recess portion 73B to the locking portion 74B is greater than the maximum thickness of the first FPC 40, the first FPC 40 is held in the recess portion 73B so that the first FPC 40 does not protrude rearward. Thus, as was the case in the description above regarding the recess portion 73A and the locking portion 74A of the first protector 70A, damage to the first FPC 40 as a result of the first FPC 40 being caught between the second protector 70B and the upper cover 80U when the upper cover 80U is attached is suppressed.

Bus Bars

The bus bars 30 have a plate-like shape, and are formed by machining electroconductive metal plates. The bus bars 30 include the first bus bars 30A held by the first bus bar module 10A, and the second bus bars 30B held by the second bus bar module 10B. As illustrated in FIGS. 3 and 6, first bus bars 30A are held by the groove portions 72, which are provided in the upper side of the first protector 70A, so that the thickness direction of the first bus bars 30A corresponds to the left-right direction. As illustrated in FIG. 3, connection portions 32 are provided in the lower parts of the first bus bars 30A. The connection portions 32 are electrically connected to later-described first conduction paths 43 of the first FPC 40 by soldering. As illustrated in FIG. 6, the center portions of the first bus bars 30A constitute main body portions 31 to which electrode leads 21 are connected. When the first bus bar module 10A is attached to the front side of the battery-cell laminate 20L as illustrated in FIG. 3, the forward-protruding electrode leads 21 are inserted to the electrode-receiving portions 71 of the first protector 70A, and the main body portions 31 are connected by laser welding to the electrode leads 21 inserted to the electrode-receiving portions 71. Similarly to the first bus bars 30A, second bus bars 30B are also held by the groove portions 72 in the second protector 70B, and are electrically connected to later-described third conduction paths 53 of the second FPC 50 at connection portions 32, as illustrated in FIG. 4. Main body portions 31 of the second bus bars 30B are connected to the rearward-protruding electrode leads 21 by laser welding.

First FPC and First Base Film

As illustrated in FIG. 11, the first FPC 40 includes a first base film 42A (one example of the base film), which is a part of the divided base film 62A that is on the first protector 70A side, the first conduction paths 43 and the second conduction paths 44 disposed on the first base film 42A, among the plurality of conduction paths 63, and a first coverlay film 42B covering the first conduction paths 43 and the second conduction paths 44, among the coverlay films 62B. An opening is provided in advance in the first coverlay film 42B so that end portions of the first conduction paths 43 and the second conduction paths 44 are exposed therefrom. Thus, electrical connection via soldering can be performed at the end portions of the first conduction paths 43 and the second conduction paths 44.

Reinforcement Plate

As illustrated in FIG. 3, the first FPC 40 has an inverted T-shape in a front view. The first FPC 40 is fixed to the first protector 70A using an adhesive or the like. The output connector 90 is provided in the upper end portion of the portion of the first FPC 40 that is fixed to the first protector 70A. As illustrated in FIGS. 9 and 11, the output connector 90 is provided in front of the first base film 42A. As illustrated in FIG. 8, a reinforcement plate 45 is provided on the reverse side (rear side) of the first base film 42A from the output connector 90 in the front-rear direction. The reinforcement plate 45 is affixed to the rear surface of the first base film 42A using an adhesive or a pressure-sensitive adhesive. As illustrated in FIG. 6, the first FPC 40 is bent at the upper end portion of the first protector 70A, and extends further rearward. As illustrated in FIG. 1, the portion of the first FPC 40 extending in the front-rear direction is disposed on the upper outer surface 22U of the battery-cell laminate 20L. As illustrated in FIG. 12, the first connector 41 is provided to the rear end portion of the first FPC 40. The first connector 41 has a block-like shape. The first connector 41 is inserted into the later-described second connector 51 and fitted to the second connector 51.

Surface and First Conduction Paths

Figure 14:
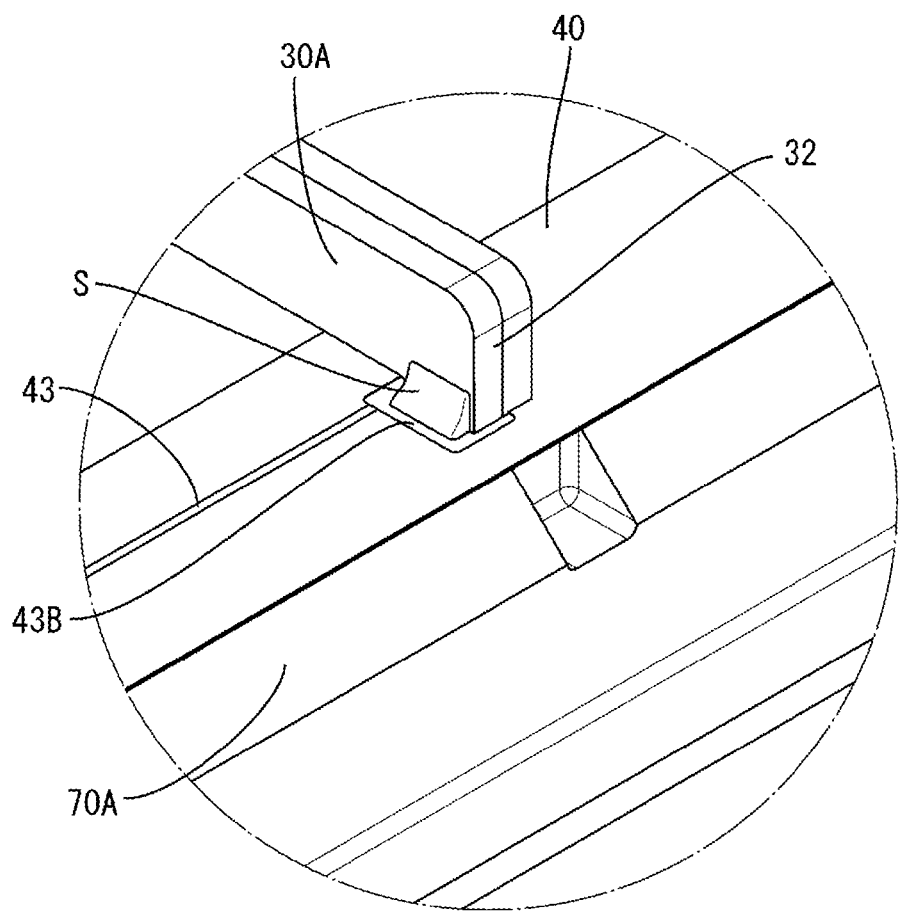
FIG. 14 is an enlarged perspective view illustrating a state in which a first land and one side surface of a connection portion of a first bus bar are soldered.

As illustrated in FIG. 11, the portion of the first FPC 40 that is fixed to the front surface of the first protector 70A is arranged so as to be orthogonal to the front-rear direction. Thus, the first base film 42A includes a surface 42S that is orthogonal to the front-rear direction on the first protector 70A. The first conduction paths 43 include upper end portions 43A that are disposed on the surface 42S in a forward-facing orientation. As illustrated in FIG. 8, the upper end portions 43A are soldered and electrically connected to connection portions 92A of the output connector 90. As illustrated in FIG. 11, the first conduction paths 43 extend downward from the upper end portions 43A. As illustrated in FIG. 3, first lands 43B (one example of the lands) are formed in the end portions of the first conduction paths 43 on the opposite side to the upper end portions 43A. The first lands 43B are made from metal foils that are the same as those of the first conduction paths 43, and have rectangular shapes. The first lands 43B are arranged side by side in the left-right direction in the lower side of the first FPC 40. As illustrated in FIG. 14, each first land 43B is formed so as to be disposed on the right side of a connection portion 32 of a first bus bar 30A, and is electrically connected to the right side surface of the connection portion 32 of the first bus bar 30A using solder S. By adopting a configuration in which each first land 43B and one side surface of a connection portion 32 of a first bus bar 30A are soldered in such a manner, soldering work can be performed efficiently using a conventional soldering iron.

Figure 15:
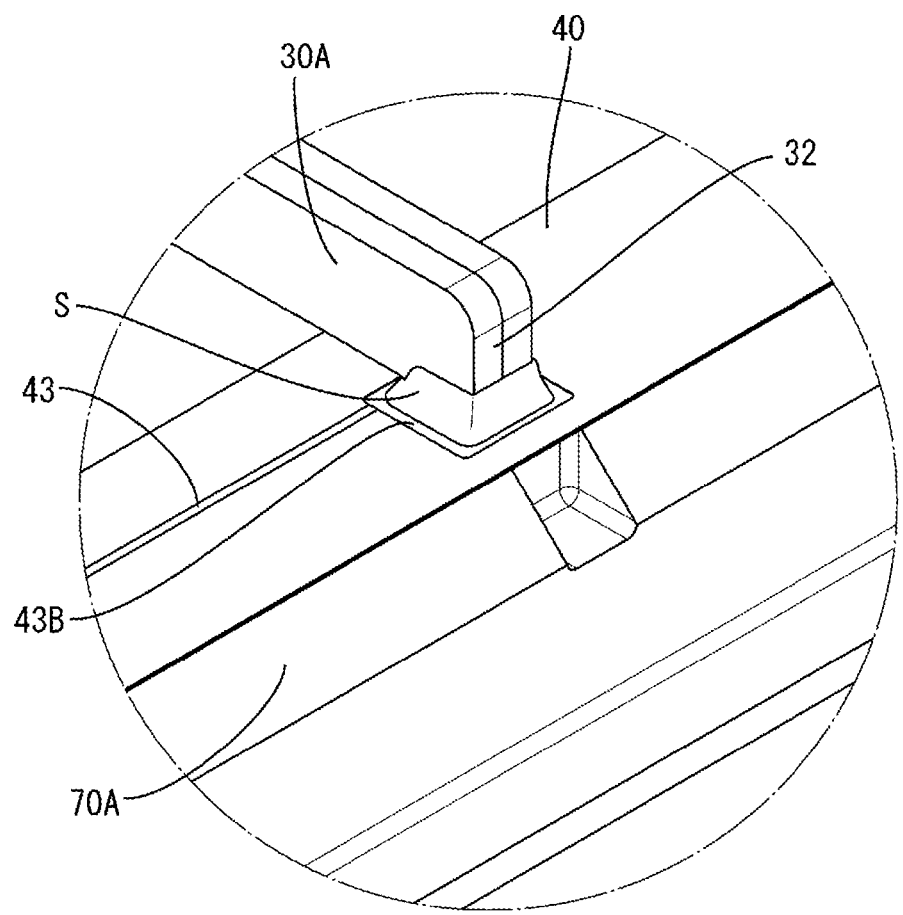
FIG. 15 is an enlarged perspective view illustrating a state in which the first land and four side surfaces of the connection portion of the first bus bar are soldered.

Alternatively, a form may be adopted in which each first land 43B is formed so as to be disposed on both the left and right sides or in a peripheral edge portion of a connection portion 32 of a first bus bar 30A, and is soldered to a plurality of side surfaces of the connection portion 32 of the first bus bar 30A. For example, as illustrated in FIG. 15, each first land 43B may be disposed in the peripheral edge portion of a connection portion 32 of a first bus bar 30A, and may be electrically connected to the four side surfaces of the connection portion 32 of the first bus bar 30A using the solder S. In this case, by increasing the portion connected by the solder S, an effect of stabilizing the first bus bar 30A relative to the first FPC 40 can be obtained. While this may give rise to a problem in work efficiency because the number of side surfaces of the connection portion 32 of the first bus bar 30A that need to be soldered increases, work efficiency can be improved by using a special soldering iron that is tailored to the shape of the connection portions 32 of the first bus bars 30A, for example.

Second Conduction Paths

As illustrated in FIG. 11, the second conduction paths 44 include front end portions 44A that are disposed on the surface 42S in a forward-facing orientation. The front end portions 44A are disposed side by side with the upper end portions 43A in the left-right direction. As illustrated in FIG. 8, the front end portions 44A are electrically connected to connection portions 92A of the output connector 90 by soldering. As illustrated in FIGS. 10 and 11, the second conduction paths 44 extend upward from the front end portions 44A, are bent in the vicinity of an opening portion 93 of the output connector 90, and extend rearward. Here, it is preferable that the vicinity of the opening portion 93 be a position lower than the upper end of the output connector 90, as illustrated in FIG. 8. When the second conduction paths 44 are bent at such a position, a mating connector (unillustrated) and the output connector 90 can be easily fitted to and separated from one another because the mating connector does not readily come into contact with the second conduction paths 44 when the mating connector and the output connector 90 are fitted to and separated from one another. As illustrated in FIG. 9, the second conduction paths 44 extending rearward are passed through the recess portion 73A of the first protector 70A, and are arranged so that the second conduction paths 44 can be locked by the locking portion 74A. As illustrated in FIG. 12, the end portions of the second conduction paths 44 on the opposite side to the front end portions 44A constitute rear end portions 44B. The rear end portions 44B are electrically connected to connection portions 41A of the first connector 41 by soldering. The first connector 41 fits into the second connector 51 (see FIG. 13) held by the second protector 70B from above, and the second conduction paths 44 are bent downward at the upper end portion of the second protector 70B. The second conduction paths 44 are passed through the recess portion 73B of the second protector 70B, and are arranged so that the second conduction paths 44 can be locked by the locking portion 74B.

Output Connector, Opening Portion, Opposing Surface, and Connection Portions

Figure 7:
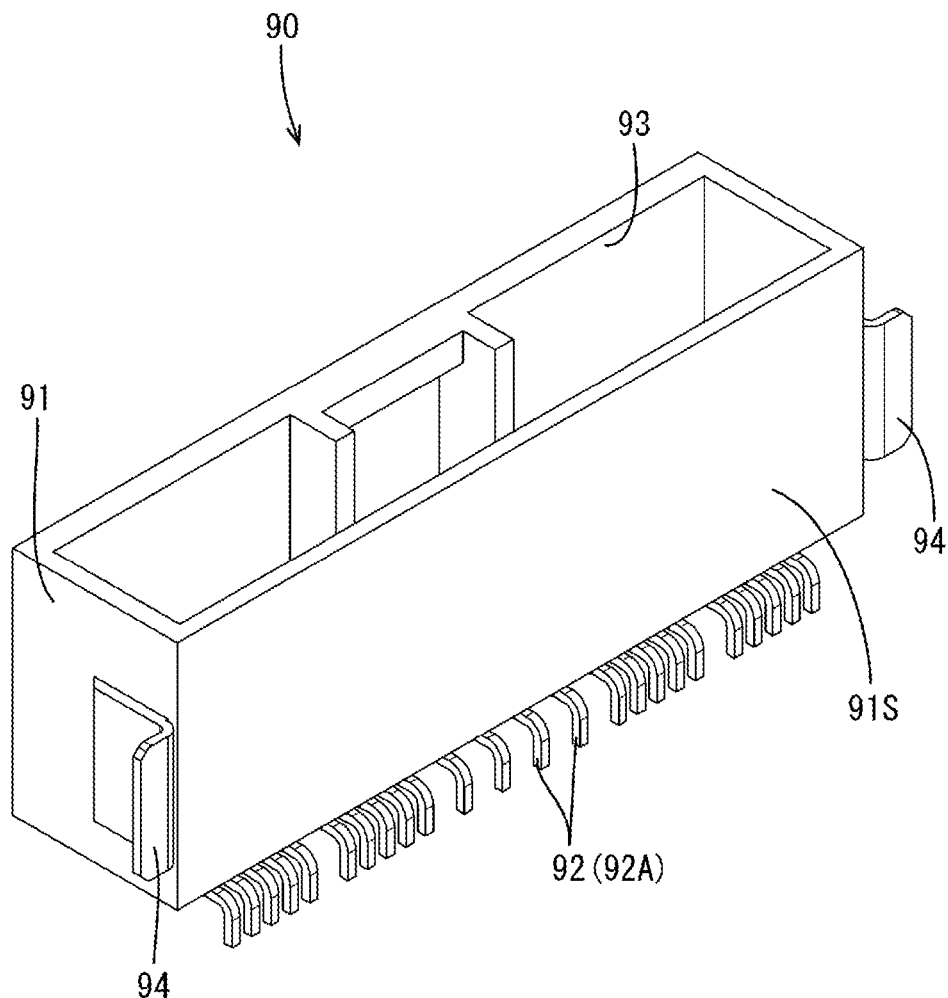
FIG. 7 is a perspective view of an output connector.

As illustrated in FIG. 7, the output connector 90 includes a housing 91 that has a rectangular parallelepiped box-like shape that is long in the left-right direction, and a plurality of terminals 92. The housing 91 has the opening portion 93, which is open upward. The opening portion 93 receives the mating connector (unillustrated) that is fitted to the output connector 90. This mating connector is provided in a terminal end portion of the above-described ECU, and the battery cells 20 are electrically connected to the ECU by the output connector 90 and the mating connector being fitted to one another. The rear surface of the housing 91 constitutes an opposing surface 91S that opposes the surface 42S when the output connector 90 is attached to the surface 42S. Metal fixing portions 94 are provided on the side surfaces of the housing 91 in the left-right direction. As illustrated in FIGS. 9 and 11, the output connector 90 is fixed to the surface 42S by the fixing portions 94 and fixing lands 46 provided on the surface 42S being soldered to one another. As illustrated in FIG. 8, the terminals 92 are held by a bottom wall 91A of the housing 91, and the tip portions of the terminals 92 extend upward inside the housing 91. Below the bottom wall 91A, the terminals 92 are bent toward the rear in a crank shape, and the lower end portions of the terminals 92 constitute the connection portions 92A. The connection portions 92A are electrically connected to the upper end portions 43A and the front end portions 44A by soldering. Thus, the output connector 90 is surface mounted to the first FPC 40.

As illustrated in FIGS. 9 and 11, the first conduction paths 43 are drawn out from the upper end portions 43A connected to the output connector 90 toward the opposite side to the direction in which the opening portion 93 is open (i.e., drawn out downward). On the other hand, the second conduction paths 44 are drawn out from the front end portions 44A connected to the output connector 90 toward the opening portion 93 (i.e., drawn out upward) through a space between the surface 42S and the opposing surface 91S (see FIG. 7) of the output connector 90. For example, as a configuration relating to the routing of the second conduction paths that is different from that in the present embodiment, a configuration (referred to herein as a detouring routing) is also conceivable in which the second conduction paths extend downward from the connection portions 92A and are then drawn out toward the rear via the right or left side of the output connector 90 so that the second conduction paths make a detour around the surface 42S opposite the opposing surface 91S. However, because the second conduction paths 44 are disposed between the surface 42S and the opposing surface 91S in the present embodiment, the space necessary for routing the second conduction paths 44 can be reduced compared to a case in which the above-described detouring routing is adopted.

Second FPC and Second Base Film

Figure 13:
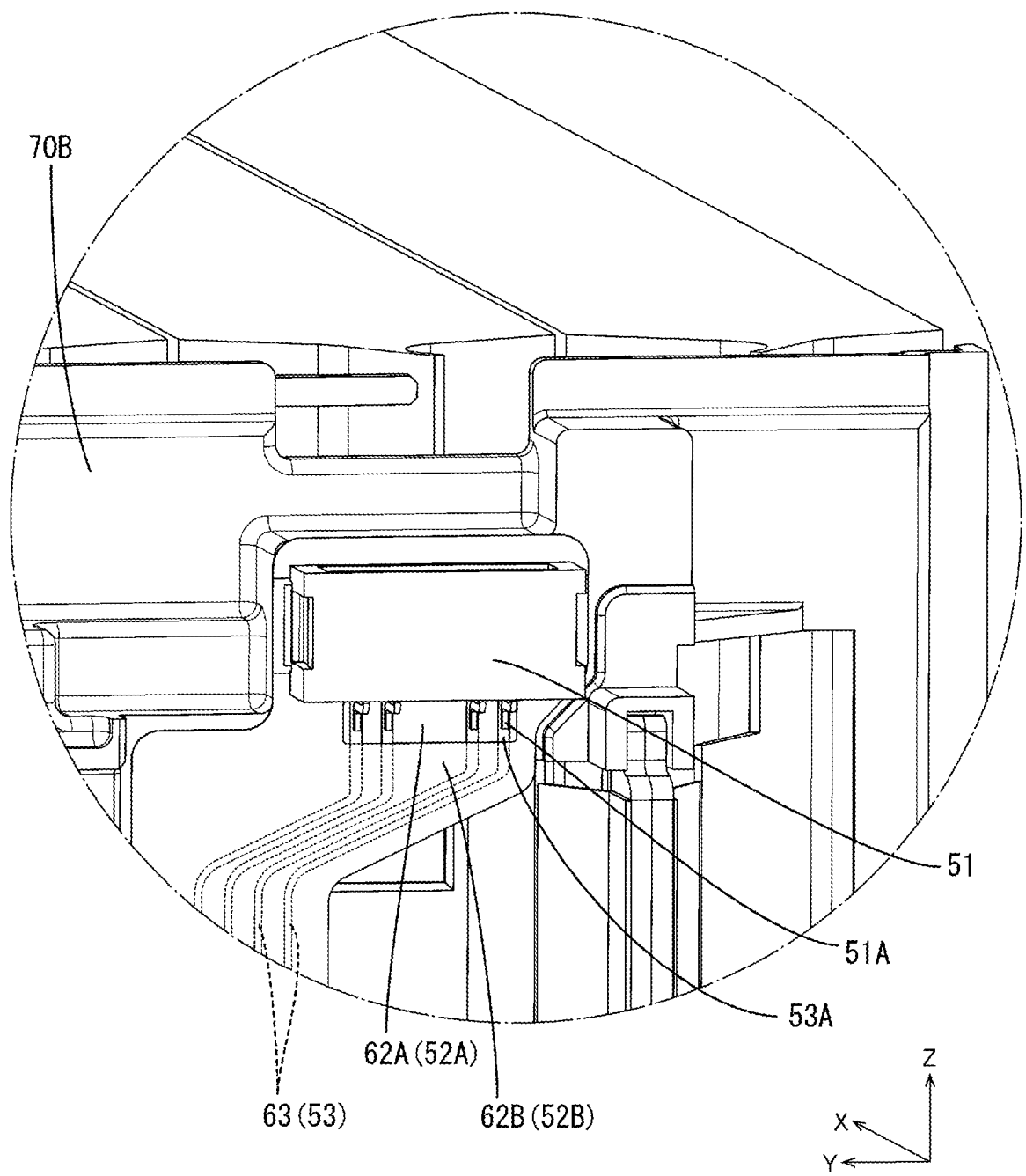
FIG. 13 is a perspective view in which a first connector and a first flexible printed circuit board in FIG. 12 have been omitted.

As illustrated in FIG. 13, the second FPC 50 includes a second base film 52A (one example of the base film), which is a part of the divided base film 62A that is on the second protector 70B side, third conduction paths 53 (one example of the plurality of conduction paths) disposed on the second base film 52A, among the plurality of conduction paths 63, and a second coverlay film 52B covering the third conduction paths 53, among the coverlay films 62B. An opening is provided in advance in the second coverlay film 52B so that end portions of the third conduction paths 53 are exposed therefrom. Thus, electrical connection via soldering can be performed at the end portions of the third conduction paths 53.

Third Conduction Paths

As illustrated in FIG. 4, the second FPC 50 has an inverted T-shape, and the portion of the second FPC 50 extending in the up-down direction is disposed toward the right side from the center of the second FPC 50. The second FPC 50 is fixed to the second protector 70B using an adhesive or the like. The second connector 51 is provided to the upper end portion of the second FPC 50. Although not illustrated, a reinforcement plate is provided on the reverse side (front side) of the second base film 52A from the second connector 51 in the front-rear direction. The reinforcement plate is affixed to the front surface of the second base film 52A using an adhesive or a pressure-sensitive adhesive. As illustrated in FIG. 13, the second connector 51 is shaped so as to be open upward. Connection portions 51A of the second connector 51 are electrically connected to upper end portions 53A of the third conduction paths 53. The third conduction paths 53 extend downward, and second lands 53B (one example of the lands) are formed in the end portions of the third conduction paths 53 on the opposite side to the upper end portions 53A, as illustrated in FIG. 4. The second lands 53B are arranged side by side in the left-right direction in the lower end portion of the second FPC 50, and are electrically connected to the connection portions 32 of the second bus bars 30B. The second lands 53B and the connection portions 32 of the second bus bars 30B are connected in the same way as the first lands 43B and the connection portions 32 of the first bus bars 30A are connected (see FIG. 14). As illustrated in FIG. 12, by the first connector 41 being inserted into the second connector 51, the second connector 51 and the first connector 41 are fitted to one another, and the third conduction paths 53 and the second conduction paths 44 are connected to one another. Thus, the second bus bars 30B and the output connector 90 are connected.

Attachment of Wiring Modules to Battery-Cell Laminate

As illustrated in FIG. 1, the first bus bar module 10A is attached to the front side of the battery-cell laminate 20L. As illustrated in FIG. 6, the first FPC 40 extending toward the rear from the upper end portion of the first protector 70A is passed through the recess portion 73A and arranged below and behind the locking portion 74A in advance. As illustrated in FIG. 1, the forward-protruding electrode leads 21 are inserted to the electrode-receiving portions 71, and the electrode leads 21 and the first bus bars 30A are joined by laser welding. Similarly, the second bus bar module 10B is also attached to the rear side of the battery-cell laminate 20L.

Next, as illustrated in FIG. 12, the first connector 41 and the second connector 51 are fitted to one another after the first connector 41 side of the first FPC 40 is passed through the recess portion 73B of the second protector 70B and arranged in front of and below the locking portion 74B. The output connector 90 and the bus bars are electrically connected by the first connector 41 and the second connector 51 being fitted to one another. Thus, the attachment of the wiring modules 10 to the battery-cell laminate 20L is complete (see FIG. 1). Note that the covers 80 are attached to the outer surfaces 22 of the battery-cell laminate 20L having the wiring modules 10 attached thereto (see FIG. 2).

Operation and Effects of Embodiment 1

The following operation and effects are achieved according to embodiment 1.

A wiring module 10 according to embodiment 1 is a wiring module 10 attached to a battery-cell laminate 20L, including: an FPC 60; and a protector 70 holding the FPC 60, wherein the FPC 60 includes a base film 62A, a plurality of conduction paths 63 that are disposed on a surface 42S of the base film 62A, and an output connector 90 that has an opposing surface 91S opposing the surface 42S of the base film 62A and that is connected to the plurality of conduction paths 63, the plurality of conduction paths 63 and electrode leads 21 of the battery-cell laminate 20L are electrically connected, the output connector 90 includes connection portions 92A that are connected to the plurality of conduction paths 63, and at least some of the plurality of conduction paths 63 are routed from the connection portions 92A through a space between the surface 42S of the base film 62A and the opposing surface 91S of the output connector 90.

According to the above-described configuration, the space necessary for routing the plurality of conduction paths 63 can be reduced because at least some of the plurality of conduction paths 63 pass through the space between the surface 42S of the base film 62A and the opposing surface 91S of the output connector 90. Accordingly, the height of the wiring module 10 and the space occupied by the wiring module 10 can be reduced.

In embodiment 1, the surface 42S of the base film 62A intersects the front-rear direction, the output connector 90 has an opening portion 93 that is open in the upward direction intersecting the front-rear direction and that receives a mating connector that is fitted to the output connector 90, and the connection portions 92A are disposed below the output connector 90.

According to the above-described configuration, the fitting of the output connector 90 and the mating connector to one another can be performed in the up-down direction.

In embodiment 1, the plurality of conduction paths 63 include first conduction paths 43 that are routed from the connection portions 92A toward the opposite direction from the opening portion 93, and second conduction paths 44 that are routed from the connection portions 92A through the space between the surface 42S of the base film 62A and the opposing surface 91S of the output connector 90.

According to such a configuration, the height of the wiring module 10 and the space occupied by the wiring module 10 can be reduced to a further extent.

In embodiment 1, the second conduction paths 44 are routed from the connection portions 92A toward the opening portion 93. Furthermore, the second conduction paths 44 are bent in the vicinity of the opening portion 93 of the output connector 90 and routed toward the rear.

According to the above-described configuration, because the second conduction paths 44 extend toward the rear instead of extending in the upward direction in which the output connector 90 is open, the output connector 90 and the mating connector can be easily fitted to and separated from one another.

In embodiment 1, a reinforcement plate 45 is provided on the reverse side of the first base film 42A from the output connector 90 in the front-rear direction.

According to the above-described configuration, the strength of the first FPC against stress applied thereto when the output connector 90 and the mating connector are fitted to and separated from one another can be improved.

In embodiment 1, recess portions 73A and 73B in which the bent second conduction paths 44 are routed are provided in the upper end portions of a first protector 70A and a second protector 70B.

According to the above-described configuration, because the clearance between an upper cover 80U and each of the first protector 70A and the second protector 70B increases due to the recess portions 73A and 73B, the second conduction paths 44 are less susceptible to being damaged by being caught between the upper cover 80U, and each of the first protector 70A and the second protector 70B.

In embodiment 1, the first protector 70A and the second protector 70B are provided with locking portions 74A and 74B for locking the second conduction paths 44 routed in the recess portions 73A and 73B.

According to the above-described configuration, because the position of the second conduction paths 44 can be restricted using the locking portions 74A and 74B, the second conduction paths 44 are even less susceptible to being damaged by being caught between the upper cover 80U and each of the first protector 70A and the second protector 70B.

In embodiment 1, first bus bars 30A and second bus bars 30B are connected to the electrode leads 21, the FPC 60 includes first lands 43B and second lands 53B, the first lands 43B are connected to only one side surface of first bus bars 30A by soldering, and the second lands 53B are connected to only one side surface of second bus bars 30B by soldering.

According to the above-described configuration, the work efficiency of the soldering of the first lands 43B and the first bus bars 30A to one another and the soldering of the second lands 53B and the second bus bars 30B to one another is improved.

Embodiment 2

Embodiment 2 of the present disclosure will be described with reference to FIGS. 16 and 17. In the following description, description regarding members and effects that are the same as those in embodiment 1 will be omitted. Furthermore, description will be provided regarding the directions indicated by the arrows Z and Y as the upward and left directions, respectively. Here, the front-rear direction and the up-down direction are examples of the first direction and the second direction, respectively. Note that, when more than one of a given member is provided, the reference sign therefor may be provided to only some of the members and may be omitted for the rest.

A wiring module according to embodiment 2 includes a first FPC 140 and an output connector 190 in place of the first FPC 40 and the output connector 90 in embodiment 1.

Figure 17:
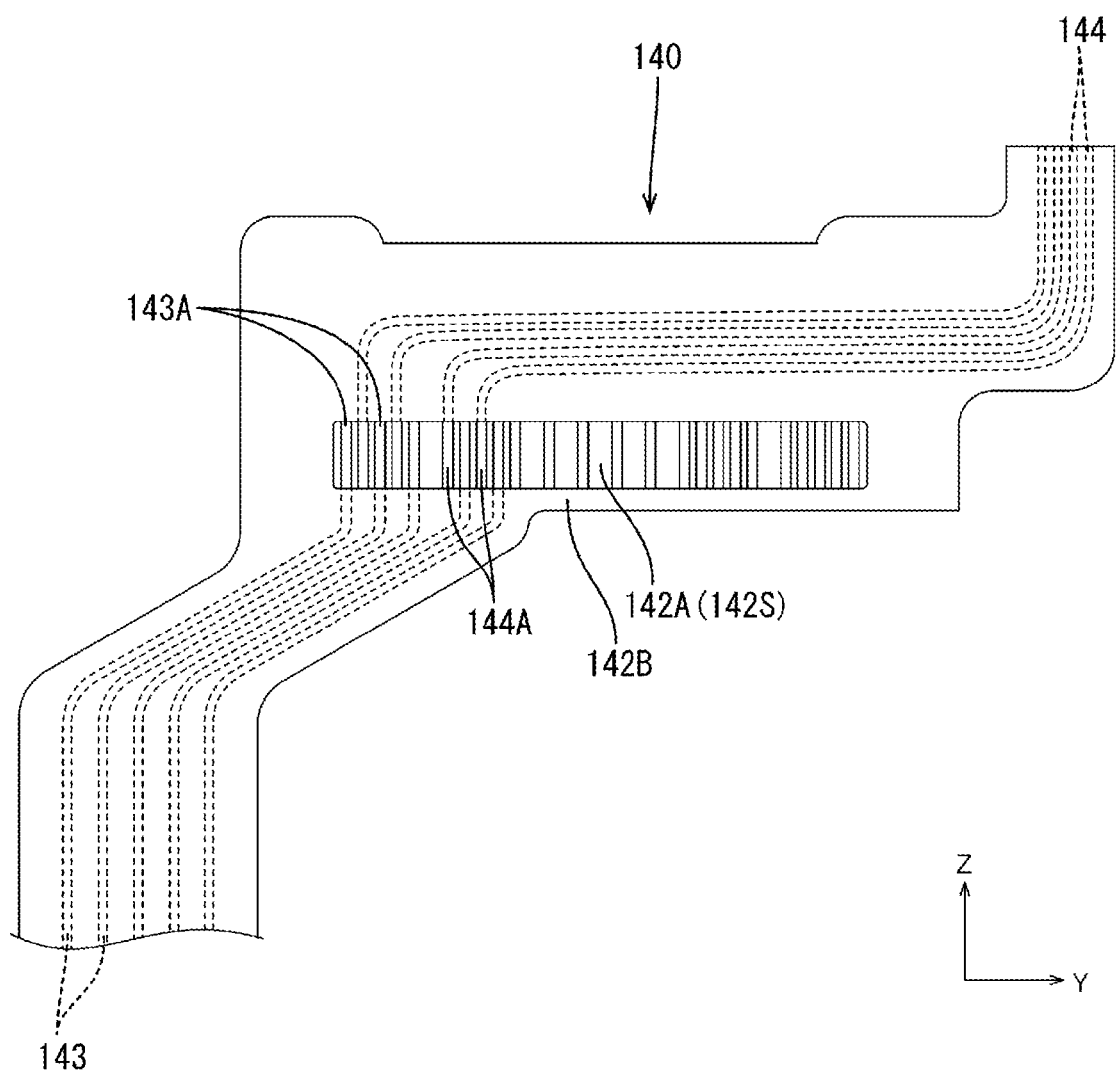
FIG. 17 is a perspective view in which the output connector in FIG. 16 has been omitted.

As illustrated in FIG. 17, the first FPC 140 includes a first base film 142A, first conduction paths 143 and second conduction paths 144 disposed on the first base film 142A, and a first coverlay film 142B that covers the first conduction paths 143 and the second conduction paths 144.

The first base film 142A includes a surface 142S that is orthogonal to the front-rear direction (direction that is vertical to the drawing sheets). The first conduction paths 143 include upper end portions 143A that are disposed on the surface 142S in a forward-facing orientation (orientation facing the front side in the direction vertical to the drawing sheets). The second conduction paths 144 include front end portions 144A that are disposed on the surface 142S in a forward-facing orientation. The front end portions 144A are disposed side by side with the upper end portions 143A in the left-right direction. The second conduction paths 144 briefly extend upward from the front end portions 144A, and then extend toward the left. After extending toward the left, the second conduction paths 144 extend upward before being bent and routed toward the rear.

Figure 16:
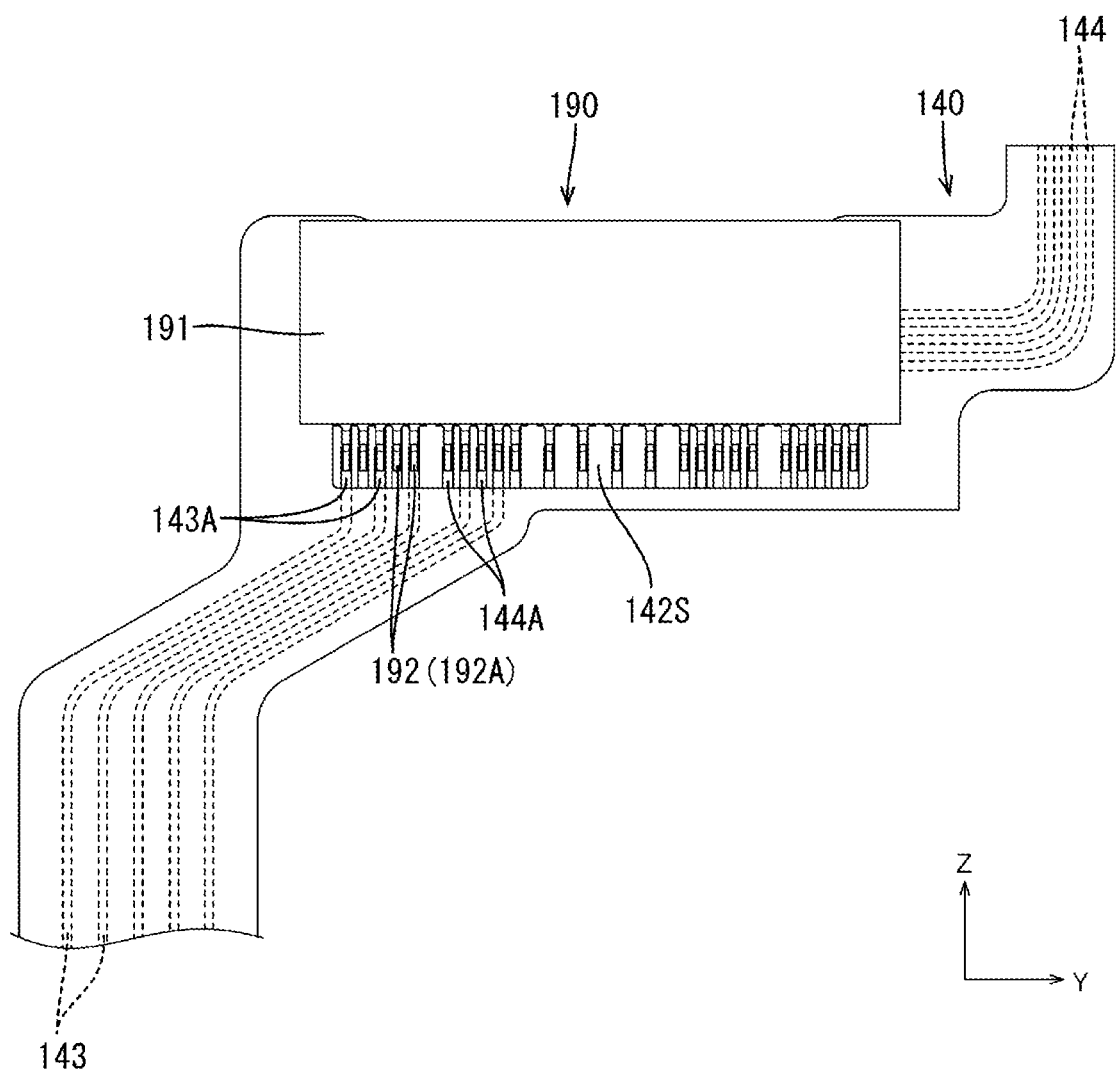
FIG. 16 is an enlarged front view illustrating a first flexible printed circuit board and an output connector according to embodiment 2.

As illustrated in FIG. 16, the output connector 190 includes a housing 191 that has a rectangular parallelepiped box-like shape that is long in the left-right direction, and a plurality of terminals 192. The housing 191 is provided so as to be open upward, and receives an unillustrated mating connector. The rear surface of the housing 191 (the surface on the rear side in the direction vertical to the drawing sheets) constitutes an opposing surface (unillustrated) that opposes the surface 142S when the output connector 190 is attached to the surface 142S. The output connector 190 is fixed to the surface 142S by means of a known technique (by soldering fixing portions, by using an adhesive, etc.). The lower end portions of the terminals 192 constitute connection portions 192A. The connection portions 192A are electrically connected to the upper end portions 143A and the front end portions 144A by soldering. Thus, the output connector 190 is surface mounted to the first FPC 140.

The second conduction paths 144 are routed from the front end portions 144A connected to the output connector 190 to the left side of the output connector 190 through a space between the surface 142S and the opposing surface of the output connector 190 (see FIGS. 16 and 17). Accordingly, the space necessary for routing the second conduction paths 144 can be reduced.

Embodiment 3

Embodiment 3 of the present disclosure will be described with reference to FIGS. 18 to 20. In the following description, description regarding members and effects that are the same as those in embodiment 1 will be omitted. Furthermore, description will be provided regarding the directions indicated by the arrows Z, X, and Y as the upward, forward, and left directions, respectively. Here, the front-rear direction is one example of the first direction. Note that, when more than one of a given member is provided, the reference sign therefor may be provided to only some of the members and may be omitted for the rest.

Wiring modules according to embodiment 3 are attached to the front and rear sides of a battery-cell laminate (unillustrated) equivalent to that in embodiment 1. Here, for simplicity, a first bus bar module 210A that is attached to the front side of the battery-cell laminate will be described in detail. The second bus bar module (unillustrated) that is attached to the rear side of the battery-cell laminate is configured so as to be similar to the first bus bar module 210A, and thus will not be described in detail.

Figure 18:
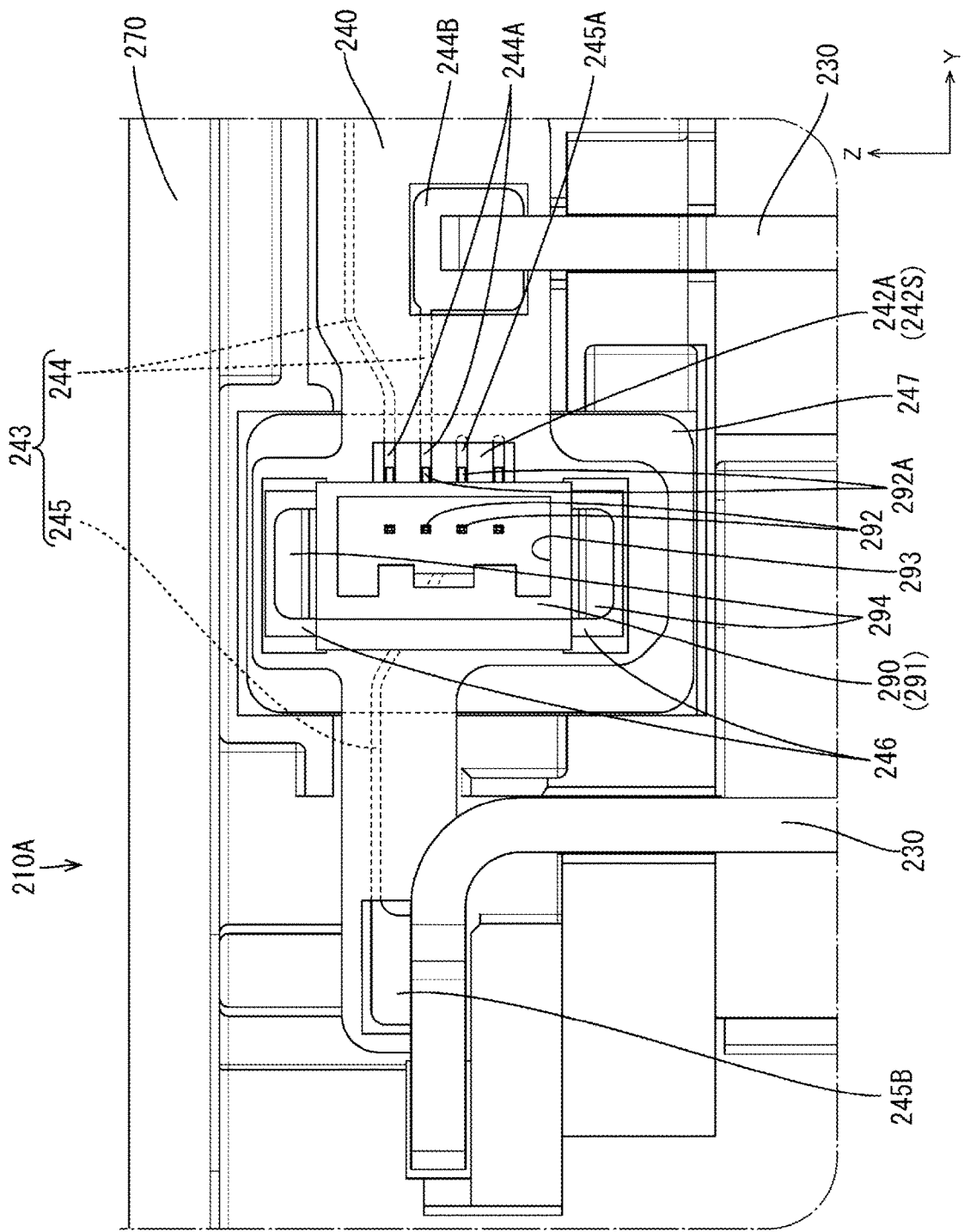
FIG. 18 is an enlarged front view of a first bus bar module according to embodiment 3.
Figure 20:
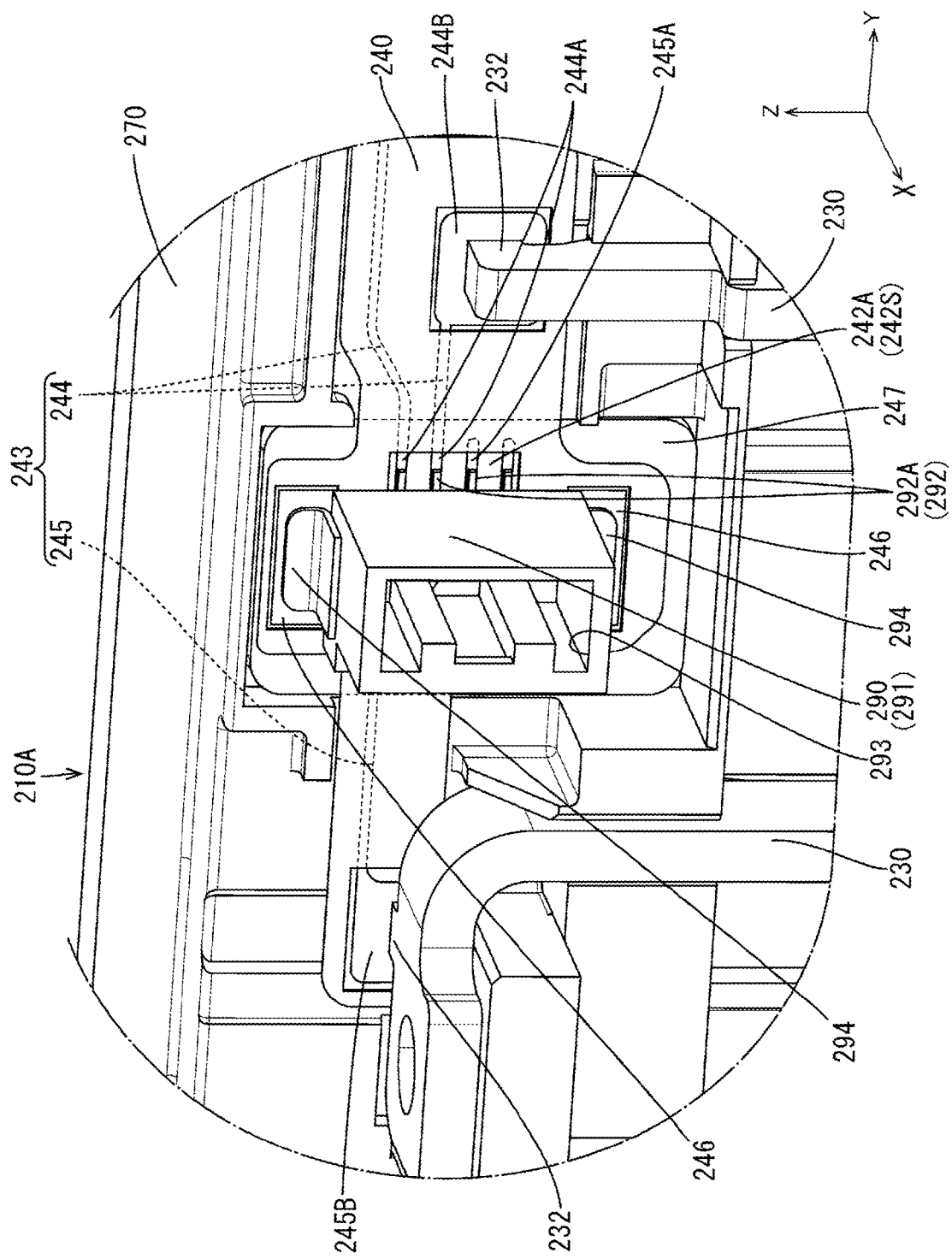
FIG. 20 is a perspective view of the first bus bar module.

As illustrated in FIGS. 18 and 20, the first bus bar module 210A includes bus bars 230, an FPC 240 connected to the bus bars 230, an output connector 290 connected to the FPC 240, and a protector 270.

As illustrated in FIG. 20, the bus bars 230 have a plate-like shape that is elongated in the up-down direction, and are held by the protector 270 in a state in which the left-right direction corresponds to the thickness direction of the bus bars 230. Connection portions 232 that are electrically connected to the FPC 240 are provided in the upper portions of the bus bars 230.

Figure 19:
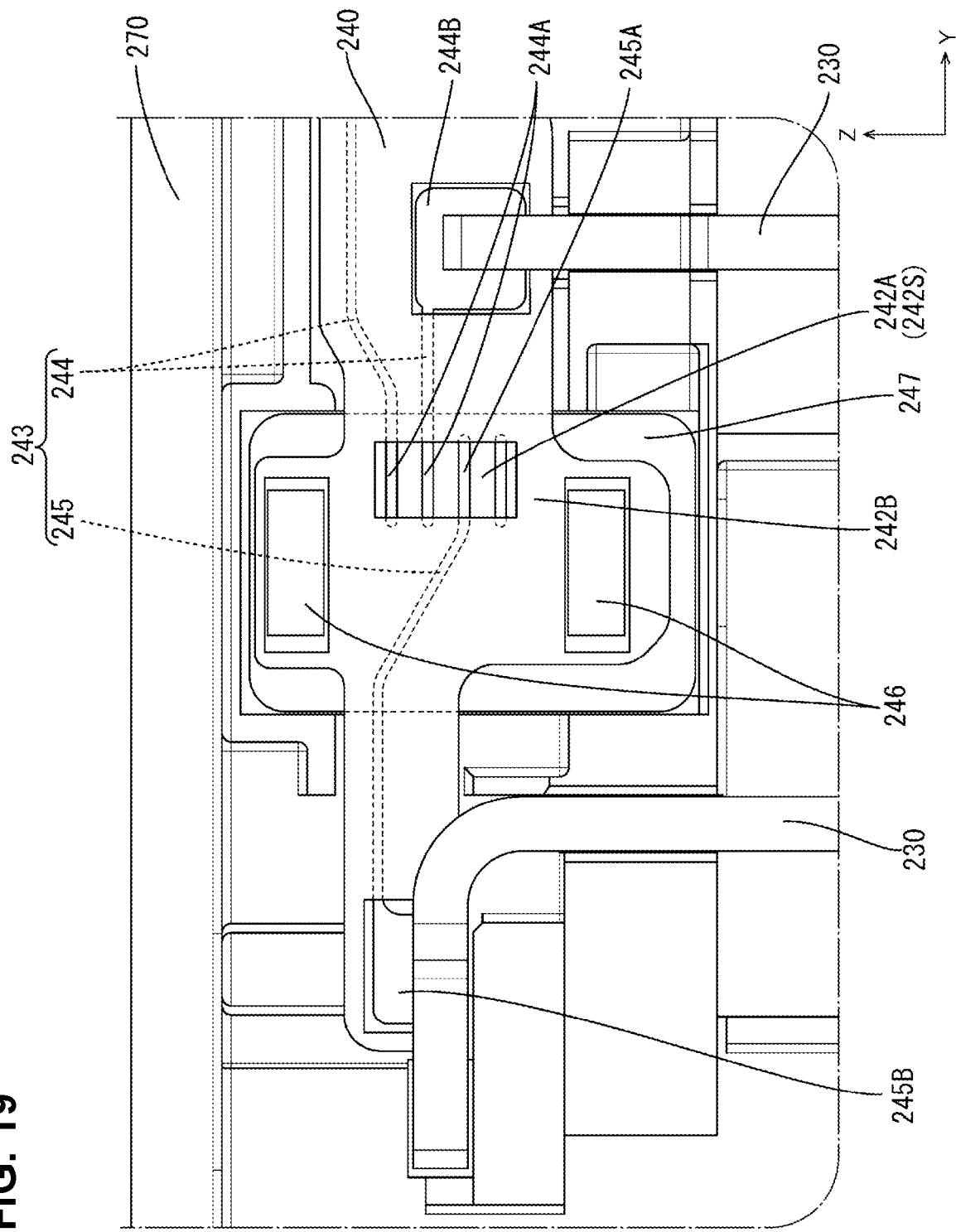
FIG. 19 is a perspective view in which an output connector in FIG. 18 has been omitted.

As illustrated in FIG. 19, the FPC 240 includes a base film 242A, a plurality of conduction paths 243 disposed on the base film 242A, and a coverlay film 242B covering the plurality of conduction paths 243. The FPC 240 is fixed to the front surface of the protector 270 using an adhesive or the like, and is arranged so as to be orthogonal to the front-rear direction. Thus, the base film 242A includes a surface 242S that is orthogonal to the front-rear direction on the protector 270.

As illustrated in FIGS. 18 and 20, the output connector 290 is provided in front of the base film 242A. A reinforcement plate 247 is provided on the reverse side (rear side) of the base film 242A from the output connector 290 in the front-rear direction. The reinforcement plate 247 is affixed to the rear surface of the base film 242A using an adhesive or the like. Note that, differing from embodiment 1, the second bus bar module is also provided with an output connector (unillustrated) similarly to the first bus bar module 210A in embodiment 3. Thus, the FPC 240 is not connected to the second bus bar module.

As illustrated in FIGS. 18 and 20, the output connector 290 includes a housing 291 that has a rectangular parallelepiped box-like shape that is long in the up-down direction, and a plurality of terminals 292. The housing 291 has an opening portion 293 that is open toward the front. The opening portion 293 receives an unillustrated mating connector. The rear surface of the housing 291 constitutes an opposing surface (unillustrated) that opposes the surface 242S when the output connector 290 is attached to the surface 242S.

As illustrated in FIGS. 18 and 20, metal fixing portions 294 are provided on side surfaces of the housing 291 that are orthogonal to the up-down direction. The output connector 290 is fixed to the surface 242S by the fixing portions 294 and fixing lands 246 provided on the surface 242S being soldered to one another. The rear end portions of the terminals 292 are bent toward the left (toward the right in the drawings), and constitute connection portions 292A. The connection portions 292A are electrically connected to the plurality of conduction paths 243 by soldering. Thus, the output connector 290 is surface mounted to the FPC 240.

As illustrated in FIGS. 18 and 20, the plurality of conduction paths 243 include fourth conduction paths 244 that are routed from the connection portions 292A of the output connector 290 toward the left (toward the right in the drawings), and a fifth conduction path 245 that is routed from the connection portions 292A toward the right (toward the left in the drawings) through a space between the surface 242S of the base film 242A and the opposing surface of the output connector 290. Right end portions 244A of the fourth conduction paths 244 and a left end portion 245A of the fifth conduction path 245 are disposed on the surface 242S so as to be arranged side by side in the up-down direction, and are connected to connection portions 292A. The end portions of the fourth conduction paths 244 on the opposite side to the right end portions 244A constitute fourth lands 244B (one example of the lands). The end portion of the fifth conduction path 245 on the opposite side to the left end portion 245A constitutes a fifth land 245B (one example of the lands). As is the case in embodiment 1, the fourth lands 244B and the fifth land 245B are connected to the connection portions 232 of the bus bars 230 by soldering (the solder is unillustrated).

Operation and Effects of Embodiment 3

The following operation and effects are achieved according to embodiment 3.

In embodiment 3, the surface 242S of the base film 242A intersects the front-rear direction, and the output connector 290 has the opening portion 293, which is open on the opposite side (front side) from the opposing surface (rear surface) in the front-rear direction and that receives a mating connector that is fitted to the output connector 290.

According to the above-described configuration, the fitting of the output connector 290 and the mating connector to one another can be performed in the front-rear direction.

Embodiment 4

Embodiment 4 of the present disclosure will be described with reference to FIGS. 21 to 23. In the following description, description regarding members and effects that are the same as those in embodiment 1 will be omitted. Furthermore, description will be provided regarding the directions indicated by the arrows Z, X, and Y as the upward, forward, and left directions, respectively. Here, the front-rear direction and the left-right direction are examples of the first direction and the second direction, respectively. Note that, when more than one of a given member is provided, the reference sign therefor may be provided to only some of the members and may be omitted for the rest.

As is the case in embodiment 3, wiring modules according to embodiment 4 are constituted by a first bus bar module and a second bus bar module, and the first bus bar module and the second bus bar module are not electrically connected. In the following, an FPC 340 and an output connector 390 attached to the first bus bar module (front-side wiring module) will be described.

Figure 22:
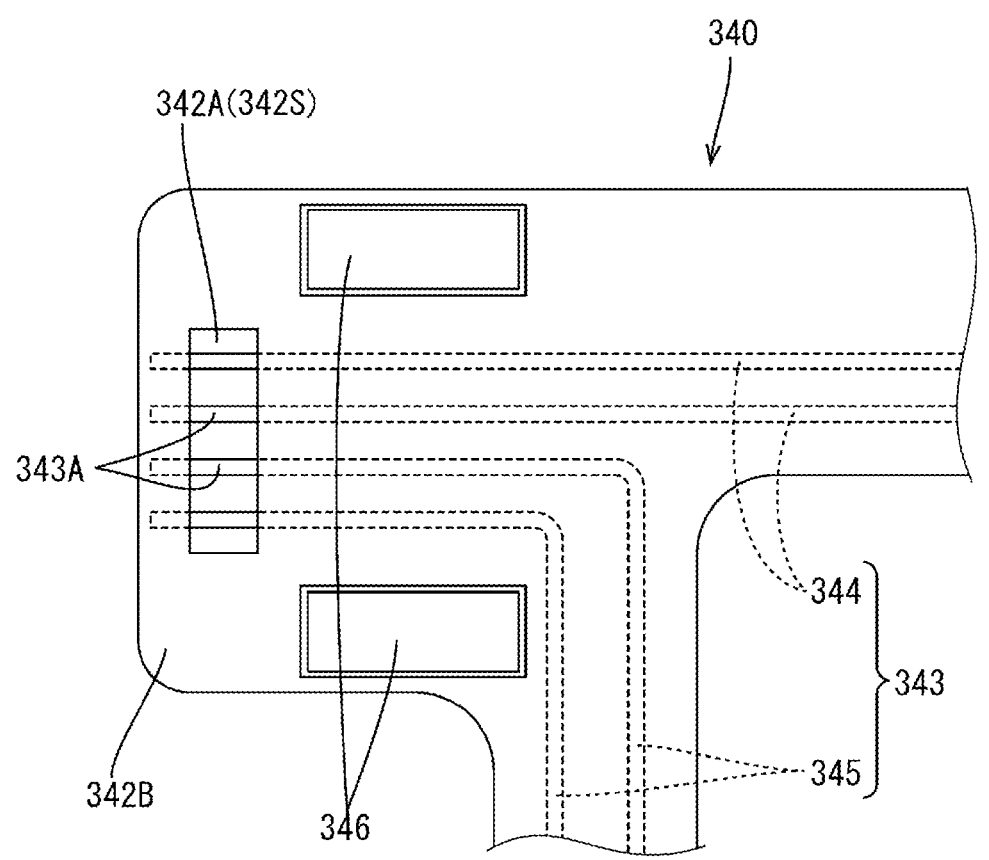
FIG. 22 is a perspective view in which the output connector in FIG. 21 has been omitted.

As illustrated in FIG. 22, the FPC 340 includes a base film 342A, a plurality of conduction paths 343 disposed on the base film 342A, and a coverlay film 342B covering the plurality of conduction paths 343. The FPC 340 is fixed to the front surface of an unillustrated protector, and is arranged so as to be orthogonal to the front-rear direction. Thus, the base film 342A includes a surface 342S that is orthogonal to the front-rear direction.

Figure 23:
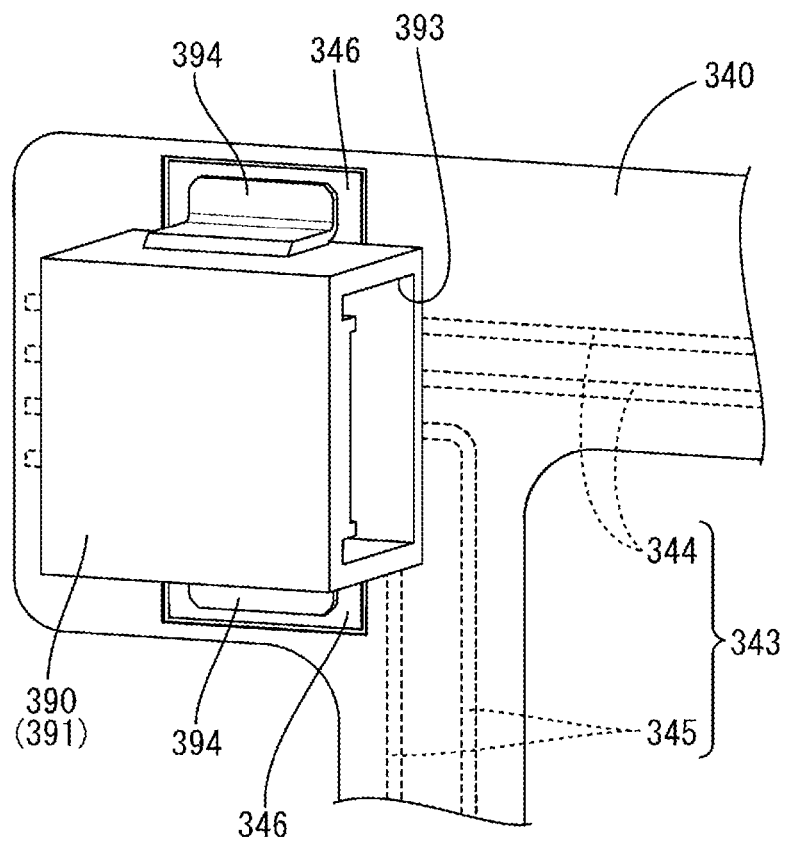
FIG. 23 is an enlarged perspective view illustrating the flexible printed circuit board and the output connector.

As illustrated in FIG. 23, the output connector 390 includes a housing 391 that has a rectangular parallelepiped box-like shape that is long in the up-down direction. The housing 391 has an opening portion 393 that is open toward the left (toward the right in the drawing). The opening portion 393 receives an unillustrated mating connector. As illustrated in FIG. 21, the output connector 390 includes terminals 392. Connection portions 392A of the terminals 392 are provided on the right side of the output connector 390. The rear surface of the housing 391 (the surface on the rear side in the direction vertical to the drawing sheets) constitutes an opposing surface (unillustrated) that opposes the surface 342S when the output connector 390 is attached to the surface 342S.

Figure 21:
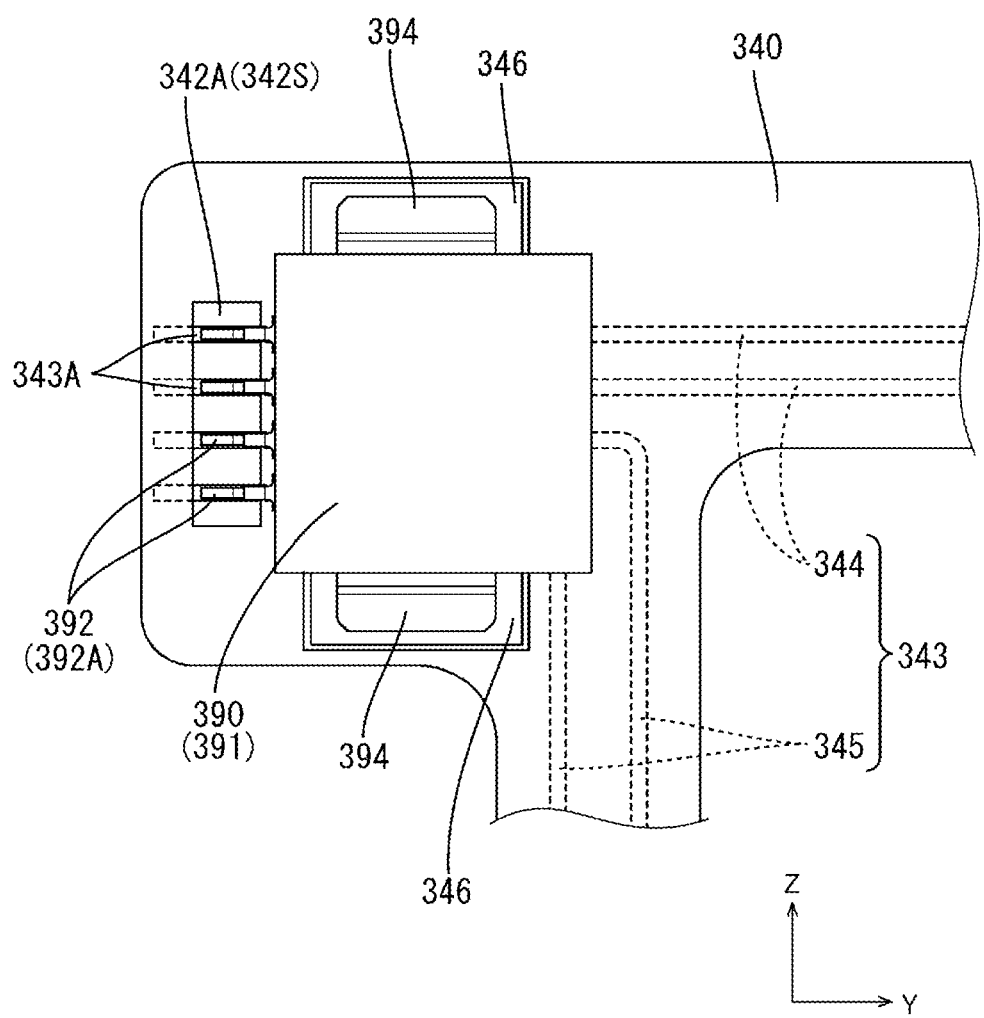
FIG. 21 is an enlarged front view illustrating a flexible printed circuit board and an output connector according to embodiment 4.

As illustrated in FIG. 21, metal fixing portions 394 are provided on side surfaces of the housing 391 that are orthogonal to the up-down direction. The output connector 390 is fixed to the surface 342S by the fixing portions 394 and fixing lands 346 provided on the surface 342S being soldered to one another. The connection portions 392A of the terminals 392 are electrically connected to right end portions 343A of the plurality of conduction paths 343 by soldering. Thus, the output connector 390 is surface mounted to the FPC 340.

As illustrated in FIGS. 21 and 23, in embodiment 4, all of the plurality of conduction paths 343 are routed from the connection portions 392A through a space between the surface 342S of the base film 342A and the opposing surface of the output connector 390. Some of the plurality of the conduction paths 343 are routed to the left side of the output connector 390, and constitute sixth conduction paths 344. The plurality of conduction paths 343 excluding the sixth conduction paths 344 are routed to the lower side of the output connector 390, and constitute seventh conduction paths 345. The sixth conduction paths 344 and the seventh conduction paths 345 are electrically connected to bus bars at end portions thereof on the opposite side to the right end portions 343A (unillustrated).

Operation and Effects of Embodiment 4

The following operation and effects are achieved according to embodiment 4.

In embodiment 4, the surface 342S of the base film 342A intersects the front-rear direction, the output connector 390 has the opening portion 393, which is open in the left side intersecting the front-rear direction and that receives a mating connector that is fitted to the output connector 390, and the connection portions 392A are disposed on the right side of the output connector 390.

According to the above-described configuration, the fitting of the output connector 390 and the mating connector to one another can be performed in the left-right direction.

Embodiment 5

Embodiment 5 of the present disclosure will be described with reference to FIGS. 24 to 26. In the following description, description regarding members and effects that are the same as those in embodiment 1 will be omitted. Furthermore, description will be provided regarding the directions indicated by the arrows Z, X, and Y as the upward, forward, and left directions, respectively. Here, the front-rear direction and the left-right direction are examples of the first direction and the second direction, respectively. Note that, when more than one of a given member is provided, the reference sign therefor may be provided to only some of the members and may be omitted for the rest.

Wiring modules 410 according to embodiment 5 include a first wiring module 410A (see FIG. 24) that is attached to the front side of a battery-cell laminate 420L, and a second wiring module (unillustrated) that is attached to the rear side of the battery-cell laminate 420L. The wiring modules 410 according to embodiment 5 differ from the wiring modules 10 according to embodiment 1 in that the wiring modules 410 do not include the bus bars 30 in embodiment 1, which connect adjacent electrode leads 21 to one another. In the following, the electrical connection between the first wiring module 410A and the battery-cell laminate 420L will be described in detail.

Figure 25:
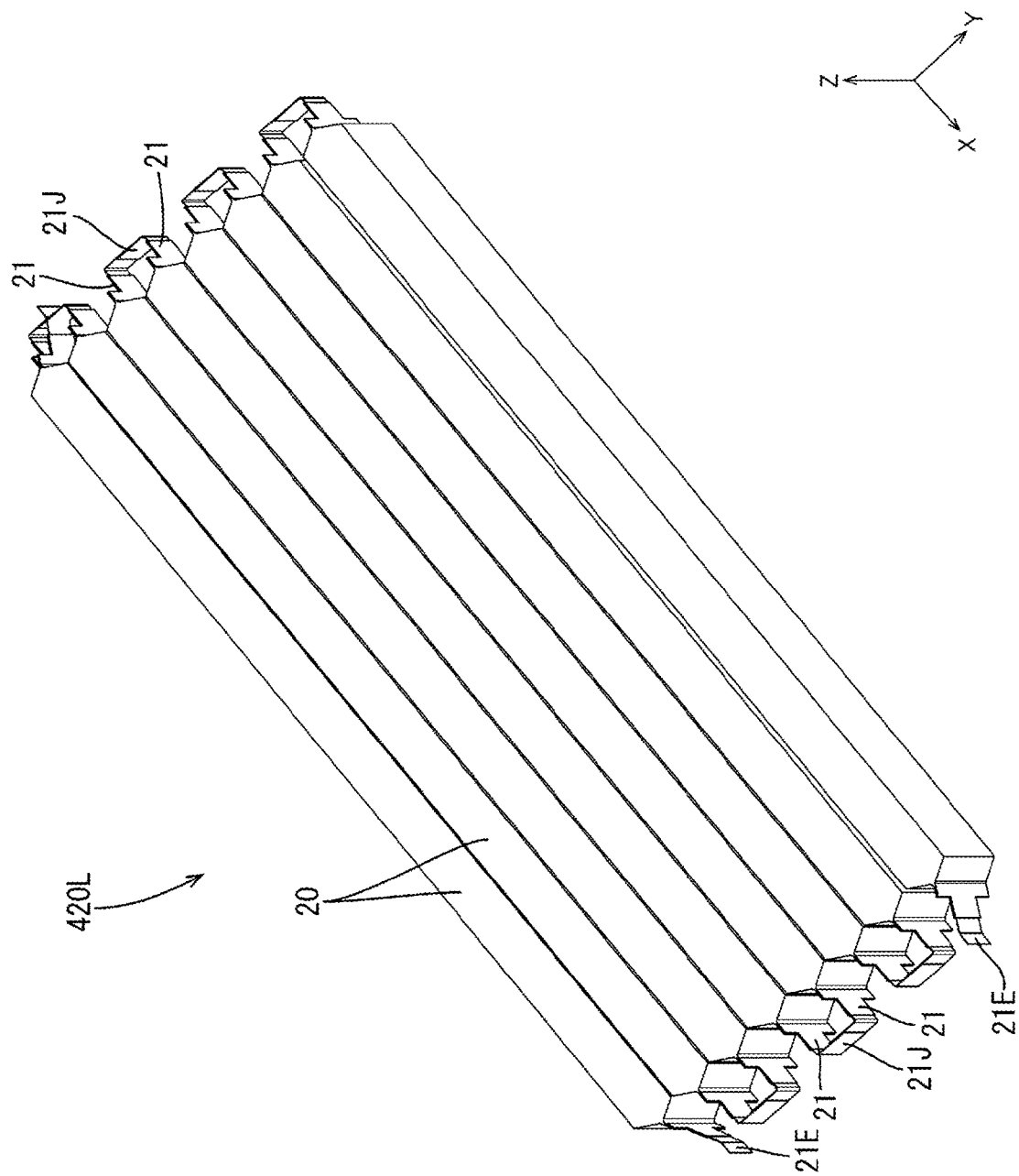
FIG. 25 is a perspective view of a battery-cell laminate including joined portions.

As illustrated in FIG. 25, the battery-cell laminate 420L is formed by arranging a plurality of battery cells 20 in the left-right direction, and adjacent electrode leads 21 are joined in advance by laser welding or the like. Specifically, adjacent electrode leads 21 are electrically connected by being bent toward one another, and form joined portions 21J. The joined portions 21J are provided so as to be parallel with the direction in which the battery cells 20 are stacked (left-right direction). Electrode leads 21 that are disposed in the two end portions of the battery-cell laminate 420L and that each form a positive electrode or a negative electrode of the entire battery-cell laminate 420L constitute end-portion electrode leads 21E. The end-portion electrode leads 21E are disposed so as to protrude toward the front.

Figure 24:
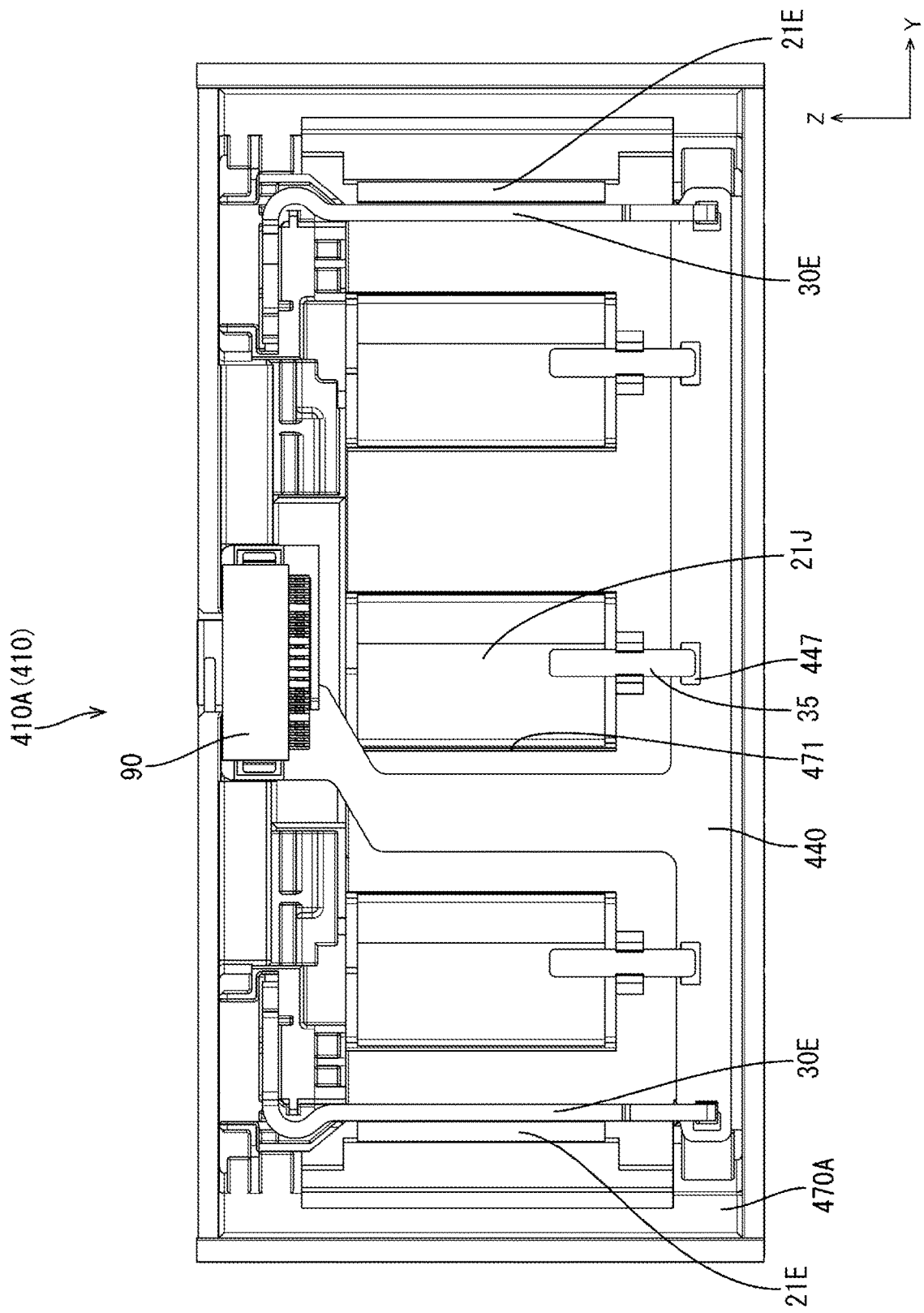
FIG. 24 is a front view of a wiring module according to embodiment 5.

As illustrated in FIG. 24, the first wiring module 410A includes end-portion bus bars 30E connected to the end-portion electrode leads 21E, sub-terminals 35 connected to the joined portions 21J, a first FPC 440, and a first protector 470A. Electrode-receiving portions 471 each receiving either a joined portion 21J or an end-portion electrode lead 21E are provided in the first protector 470A. As is the case in embodiment 1, the first FPC 440 includes first conduction paths 443 (see FIG. 26), second conduction paths (unillustrated), and an output connector 90.

Figure 26:
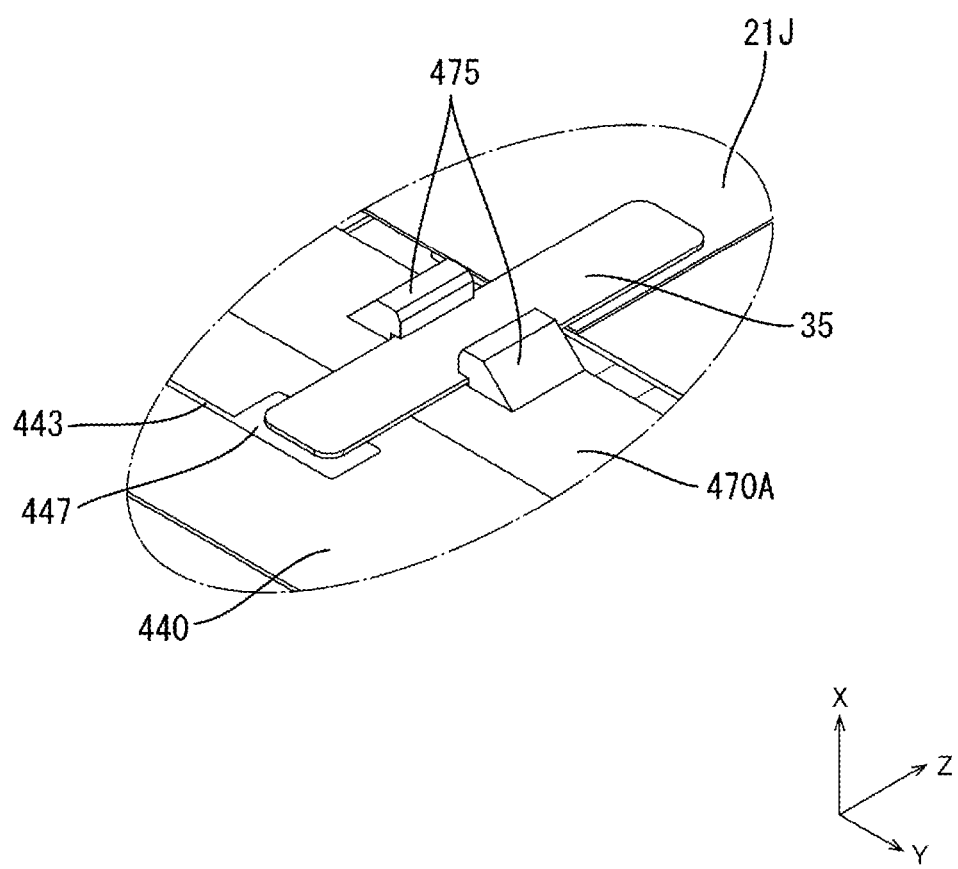
FIG. 26 is an enlarged perspective view illustrating an area of the wiring module in the vicinity of a sub-terminal.

As illustrated in FIG. 26, the sub-terminals 35 are plate-shaped members made of metal. The sub-terminals 35 are held by sub-terminal holding portions 475 of the first protector 470A. The lower end portions of the sub-terminals 35 are soldered to sixth lands 447 provided in end portions of the first conduction paths 443 of the first FPC 440. The upper end portions of the sub-terminals 35 and the joined portions 21J are electrically connected by laser welding or the like. While illustration thereof is omitted from the drawings, the second wiring module does not include the end-portion bus bars 30E, and other configurations thereof such as those relating to the sub-terminals 35 are configured so as to be similar to those of the first wiring module 410A.

As described above, bus bars for connecting adjacent electrode leads 21 to one another do not need to be used in the wiring modules 410 according to embodiment 5. This is advantageous to reduce the cost and weight of the wiring modules 410, to improve the efficiency of the work for attaching the wiring modules 410, inter alia.

Other Embodiments (1) In the above-described embodiments, laminated battery cells 20 are used as power storage elements. However, there is no limitation to this, and power storage elements other than laminated battery cells may be used.

(2) In the above-described embodiments, configurations are adopted in which the output connectors 90 and 190 are open upward, the output connector 290 is open toward the front, and the output connector 390 is open toward the left relative to the surfaces 42S, 142S, 242S, and 342S intersecting (orthogonal to) the front-rear direction. However, there is no limitation to this, and the direction in which the connectors are open can be set as desired.

(3) In embodiment 1, a configuration is adopted in which the FPC 60 is divided into the first bus bar module 10A-side first FPC 40 and the second bus bar module 10B-side second FPC 50. However, there is no limitation to this, and the FPC need not be divided.

(4) In embodiment 1, a configuration is adopted in which one locking portion (locking portion 74A or 74B) is provided to each of the recess portions 73A and 73B. However, there is no limitation to this, and a configuration in which a pair of locking portions are respectively provided on the left and right inner walls of a recess portion may be adopted, for example.

(5) In embodiment 5, a configuration is adopted in which the joined portions 21J of electrode leads 21 and the first FPC 440 are connected via the sub-terminals 35. However, there is no limitation to this. For example, a configuration may be adopted in which one of the electrode leads forming the joined portions and the first FPC has a shape extending toward the other, and the electrode leads forming the joined portions and the first FPC are directly electrically connected by soldering or the like.

LIST OF REFERENCE NUMERALS

1 Battery module
10, 410 Wiring module
10A, 210A First bus bar module
10B Second bus bar module
Battery cell
20L, 420L Battery-cell laminate
21 Electrode lead 21E End-portion electrode lead
21J Joined portion
22 Outer surface
22U Upper outer surface
30, 230 Bus bar
30A First bus bar
30B Second bus bar
30E End-portion bus bar
31 Main body portion
32, 232 Connection portion (bus bar)
35 Sub-terminal
40, 140, 440 First FPC
41 First connector
41A Connection portion (first connector)
42A, 142A First base film
42B, 142B First coverlay film
42S, 142S, 242S, 342S Surface
43, 143, 443 First conduction path
43A, 143A, 53A Upper end portion
43B First land
44, 144 Second conduction path
44A, 144A Front end portion
44B Rear end portion
45, 247 Reinforcement plate
46, 246, 346 Fixing land
50 Second FPC
51 Second connector
51A Connection portion (second connector)
52A Second base film
52B Second coverlay film
53 Third conduction path
53B Second land
60, 240, 340 FPC
62A, 242A, 342A Base film
62B, 242B, 342B Coverlay film
63, 243, 343 Conduction path
70, 270 Protector
70A, 470A First protector
70B Second protector
71, 471 Electrode-receiving portion
72 Groove portion
73A, 73B Recess portion
74A, 74B Locking portion
80 Cover
80U Upper cover
90, 190, 290, 390 Output connector
91, 191, 291, 391 Housing
91A Bottom wall
91S Opposing surface
92, 192, 292, 392 Terminal
92A, 192A, 292A, 392A Connection portion (output connector)
93, 293, 393 Opening portion
94, 294, 394 Fixing portion
244 Fourth conduction path
244A, 343A Right end portion
244B Fourth land
245 Fifth conduction path
245A Left end portion
245B Fifth land
344 Sixth conduction path
345 Seventh conduction path
410A First wiring module
447 Sixth land
475 Sub-terminal holding portion
S Solder

The invention claimed is:

1. A wiring module attached to a plurality of power storage elements, comprising:
a flexible printed circuit board; and
a protector holding the flexible printed circuit board,
wherein the flexible printed circuit board comprises a base film, a plurality of conduction paths that are disposed on a surface of the base film, and a connector that has an opposing surface opposing the surface of the base film and that is connected to the plurality of conduction paths,
the plurality of conduction paths and electrode terminals of the plurality of power storage elements are electrically connected,
the connector includes connection portions that are connected to the plurality of conduction paths, and
at least some of the plurality of conduction paths are routed from the connection portions through a space between the surface of the base film and the opposing surface of the connector.

2. The wiring module according to claim 1,
wherein the surface of the base film intersects a first direction, and
the connector has an opening portion that is open on the opposite side to the opposing surface in the first direction and that receives a mating connector that is fitted to the connector.

3. The wiring module according to claim 1,
wherein the surface of the base film intersects a first direction,
the connector includes an opening portion that is open on one side in a second direction intersecting the first direction and that receives a mating connector that is fitted to the connector, and
the connection portions are disposed on the other side of the connector in the second direction.

4. The wiring module according to claim 3,
wherein the plurality of conduction paths include first conduction paths that are routed from the connection portions toward the opposite direction from the opening portion, and second conduction paths that are routed from the connection portions through the space between the surface of the base film and the opposing surface of the connector.

5. The wiring module according to claim 4,
wherein the second conduction paths are routed from the connection portions toward the opening portion.

6. The wiring module according to claim 5,
wherein the second conduction paths are bent in the vicinity of the opening portion of the connector and routed toward a direction that is different from the second direction.

7. The wiring module according to claim 6,
wherein a reinforcement plate is provided on the reverse side of the base film from the connector in the first direction.

8. The wiring module according to claim 7,
wherein a recess portion in which the bent second conduction paths are routed is provided in an end portion of the protector on the one side in the second direction.

9. The wiring module according to claim 8,
wherein the protector is provided with a locking portion for locking the second conduction paths routed in the recess portion.

10. The wiring module according to claim 1,
wherein electroconductive members are connected to the electrode terminals,
the flexible printed circuit board includes lands, and the lands are connected to at least one side surface of the electroconductive members by soldering.

11. The wiring module according to claim 10, wherein the lands are connected to only one side surface of the electroconductive members by soldering.

* * * * *